(12) United States Patent
Fujimoto et al.

(10) Patent No.: US 6,377,500 B1
(45) Date of Patent: Apr. 23, 2002

(54) MEMORY SYSTEM WITH A NON-VOLATILE MEMORY, HAVING ADDRESS TRANSLATING FUNCTION

(75) Inventors: Akihisa Fujimoto, Fussa; Katsuyuki Nomura, Hino, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/708,423

(22) Filed: Nov. 9, 2000

(30) Foreign Application Priority Data

Nov. 11, 1999 (JP) ............................................ 11-321310
Aug. 28, 2000 (JP) ....................................... 2000-258216

(51) Int. Cl.⁷ .............................................. G11C 13/00
(52) U.S. Cl. .............................. 365/230.01; 365/230.03
(58) Field of Search ....................... 365/189.01, 189.04, 365/230.03, 230.01

(56) References Cited

U.S. PATENT DOCUMENTS 5,446,695 A * 8/1995 Douse et al. .......... 365/189.01

FOREIGN PATENT DOCUMENTS

JP          11-110283        4/1999

* cited by examiner

Primary Examiner—Terrell W. Fears
(74) Attorney, Agent, or Firm—Finnegan, Henderson, Farabow, Garrett & Dunner, L.L.P.

(57) ABSTRACT

Logical block addresses are allocated to the blocks provided on a flash memory, respectively. Address translation tables (LTPb's) are provided on the flash memory, each for a group of blocks. Groups of logical block addresses are provided, each group for one group of blocks provided on the flash memory. The logical block addresses of each group have a specific field each. The same data item is contained in the specific fields of the logical block addresses of any group. The data item designates all blocks of the group corresponding to the group of the logical block addresses. Each table has a group of entries storing physical address information indicating the locations that the blocks take in the flash memory. At least one of the tables is stored on a RAM. When a logical address is given from a host system, a microprocessor determines whether a table corresponding to the logical address exists on the RAM. If such table does not exist, the table is copied from the flash memory to the RAM. The microprocessor refers to the corresponding entry in the table on the RAM in accordance with the logical block address contained in the logical address, thereby performing translation from a logical address to a physical address.

19 Claims, 14 Drawing Sheets

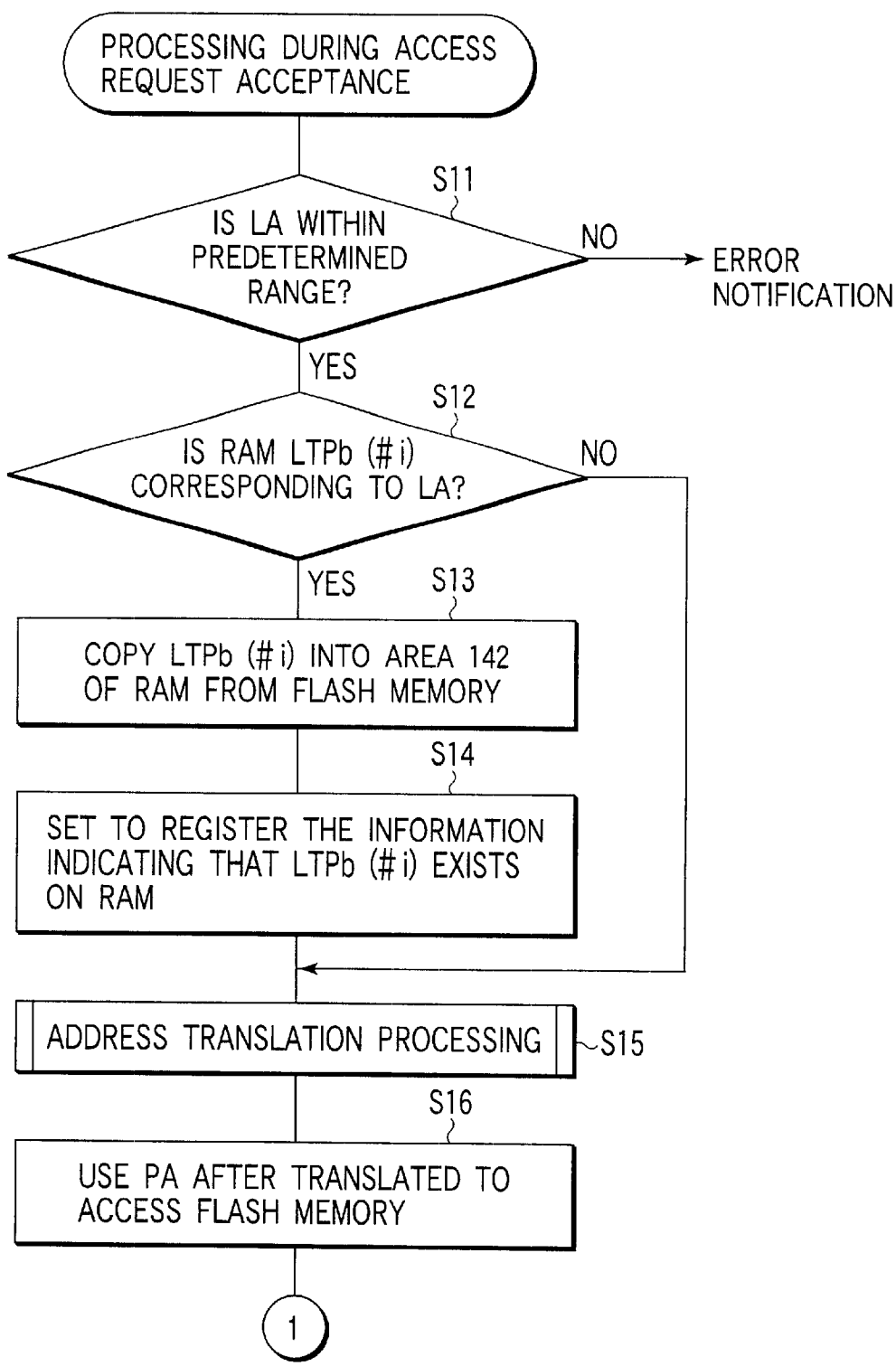
F I G. 6A

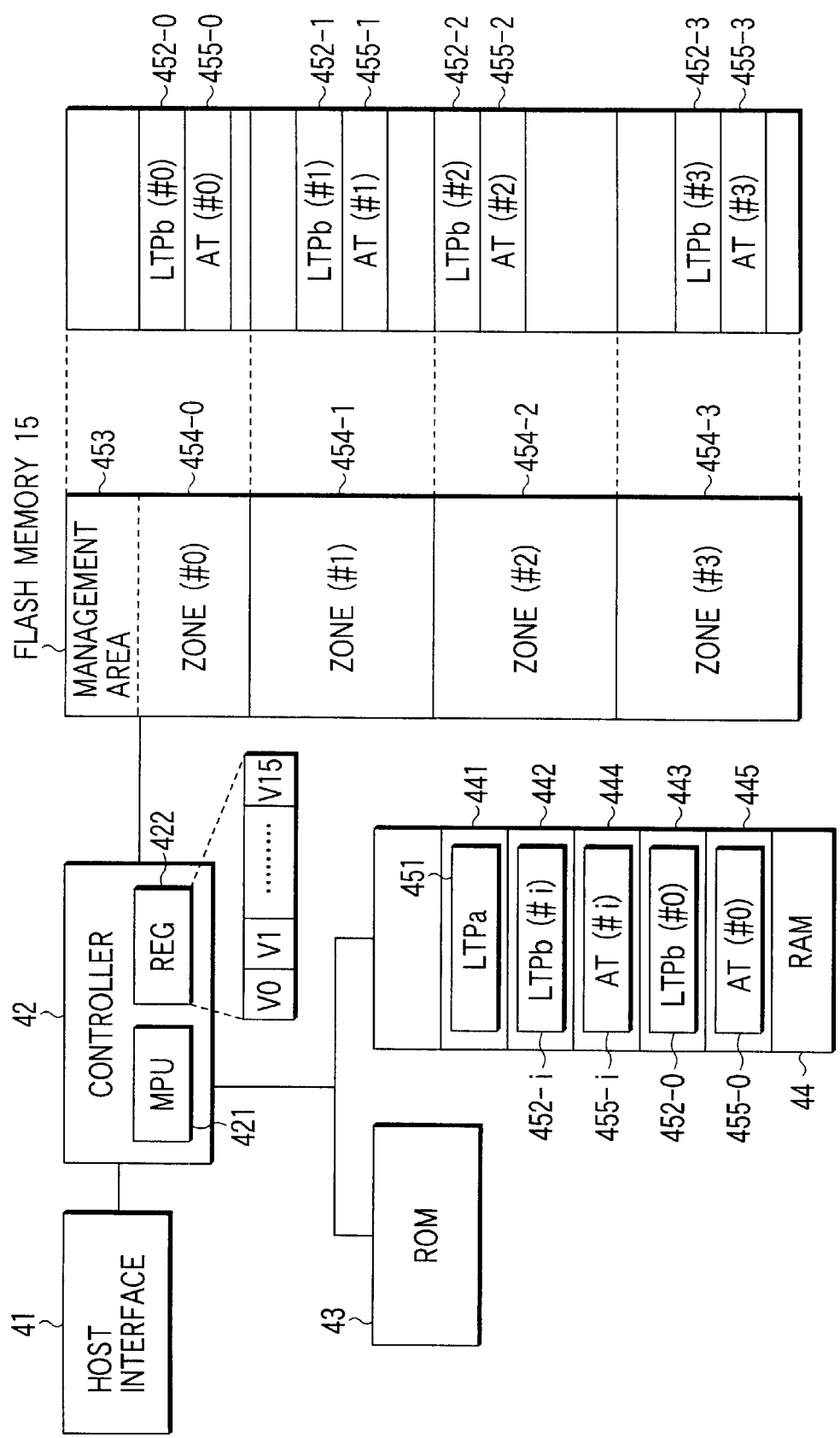
F I G. 8

| Fa | Fb | BLOCK USE STATE |
|---|---|---|
| 1 | 1 | UNUSED OR INVALID DATA |
| 0 | 1 | VALID LTPb |
| 0 | 0 | OLD LTPb |
| 1 | 0 | VALID DATA OTHER THAN LTPb |

MEMORY SYSTEM WITH A NON-VOLATILE MEMORY, HAVING ADDRESS TRANSLATING FUNCTION

CROSS-REFERENCE TO RELATED APPLICATIONS

This application is based upon and claims the benefit of priority from the prior Japanese Patent Applications No. 11-321310, filed Nov. 11; and No. 2000-258216, filed Aug. 28, 2000, the entire contents of which are incorporated herein by reference.

BACKGROUND OF THE INVENTION

The present invention pertains to a memory system with a non-volatile memory. In particular, the present invention relates to a memory system having an address translating function for translating the logical address given to access the non-volatile memory to a physical address.

In recent years, as a memory system for storing a variety of digital information represented by image data or music data, there has been widely known a memory card with a rewritable non-volatile memory in which, even if a power supply is turned OFF, stored information is not erased.

A typical example of such rewritable non-volatile memory includes a NAND type flash memory. A flash memory of such type is managed in blocks. In this memory, information is erased in blocks. The information is erased by an operation for writing data of "1" into all bits contained in blocks. In addition, a logical block address is allocated to one block. Each block consists of a plurality of sectors. Each of these sectors is a minimum unit for read/write operation in a flash memory, and consists of 512 bytes, for example. Each sector has a redundant section other than a data section. A logical block address allocated to a block to which the corresponding sector belongs is registered in a predetermined field of this redundant section.

An address translation table (an address translation mechanism) for translating a logical address to a physical address of the flash memory is required to access the flash memory. A reason required for this address translation is stated below. Namely, this is because, even if a fault block occurs in the flash memory, and is substituted by another empty block, a host system can provide access to a target block with the same logical address irrespective of the presence or absence of such substitution without worrying about the above fault and substitution.

The number of entries in the above address translation table coincides with the number of blocks in a flash memory. For example, in the case where one sector consists of 512 bytes, namely 0.5 KB (kilobytes), and a block consists of 32 sectors, i.e., in the case where a 16 MB (megabyte) flash memory having 16 KB in one block is employed, the number of entries in an address translation table is 16 MB/16 KB=1 K=1,024. The address translation table is generally employed by storing the table in an area (a RAM area) secured on RAM that is a volatile memory. Therefore, in the above example, assuming that one entry is 2 bytes, the RAM area required to store the address translation table is 2 KB.

On the other hand, there has been recently increased the storage capacity of a flash memory with advancement of semiconductor manufacturing technology. For example, there has been introduced a 32 MB flash memory in which the number of blocks is 2,048 and one block consists of 16 KB or a 64 KB flash memory in which the number of blocks is 4,096, and one block consists of 16 KB, and further, a 256 MB flash memory in which the number of blocks is 16,384, and one block consists of 16 KB.

If the storage capacity of the flash memory increases, a RAM area for holding an address translation table must be increased. For example, in the case of a 32 MB flash memory, a 64 MB flash memory, and 256 MB flash memory, a 4 KB RAM area, a 8 KB RAM area, and a 32 KB RAM area are required for the address translation table, respectively. Namely, a RAM area which is twice, four times, and 116 times as large as the 16 MB flash memory is required.

Thus, in a conventional memory card with a rewritable non-volatile memory represented by a flash memory, if the storage capacity of the memory increases, there must be increased an area of a volatile memory represented by a RAM required to hold an address translation table.

BRIEF SUMMARY OF THE INVENTION

The present invention has been made in view of the foregoing circumstance. It is an object of the present invention to provide a memory system free of increasing a volatile memory area for an address translation table even if the storage capacity of a non-volatile memory increases.

In order to achieve the aforementioned object, there is provided a memory system comprising: a non-volatile memory storing a plurality of address translation tables to translate into a physical address a logical address given to access the non-volatile memory; a volatile memory having an address translation table area for storing at least one table fewer than the total number of the tables from among the plurality of address translation tables on the non-volatile memory; and means for translating a logical address to a physical address. The address translation tables are associated with their different logical address ranges. When a logical address is given for accessing the non-volatile memory, the translating means translates the logical address into a physical address by utilizing the address translation table corresponding to the logical address on the volatile memory.

In the thus configured memory system, when a logical address is given for accessing a non-volatile memory, address translation for translating the logical address to a physical address is performed by utilizing the address translation table corresponding to the logical address on the volatile memory.

In this manner, in the present invention, at least one table rather than all of the address translation tables on the non-volatile memory is placed on a volatile memory, and the address translation tables on the volatile memory are employed for address translation from a logical address to a physical address. Thus, unlike a case in which all address translation tables are placed on a volatile memory, even if the capacity of the non-volatile memory is increased, it becomes possible to suppress an increase in storage capacity of the volatile memory.

When the address translation table placed on the volatile memory are not the address translation table corresponding to the logical address ranges to which the given logical addresses belong, address translation cannot be performed. The memory system according to the present invention further comprises: means for, when a logical address is given for accessing a non-volatile memory, determining whether the address translation table corresponding to the logical address range to which the logical address belong to exists on the volatile memory; and means for, when it is determined by the determining means that the corresponding address translation table does not exist on the volatile memory, copying the address translation table from a non-volatile memory to the address translation table area on the volatile memory, thereby replacing an original address translation table on the address translation table area.

In the thus configured memory system, when an address translation table required to translate a given logical address into a physical address does not exist in the table area, that is, in the case of table mis-hit the table is copied immediately from the non-volatile memory to the table area, and the original address translation table on the address translation table area is replaced on the address translation table. Therefore, even in the case of table mis-hit, translation from a given logical address to a physical address can be performed speedily. In the meantime, when video data or voice data is read (reproduced) consecutively from a flash memory upon a request from a host system, it is general that a logical address given from the host system is consecutive. Therefore, replacement of the address translation table does not occur frequently due to data reading of such type. It is possible to translate a logical address to a physical address speedily by utilizing the table with respect to the logical addresses that belong to the logical address ranges corresponding to the address translation tables copied to the table area.

For a better understanding of usefulness of the above configuration according to the present invention, there is considered a case in which a configuration is adopted to sequentially generate a required address translation table to be held on the table area without providing each of the address translation tables in a non-volatile memory, which is different from the present invention. In this case, during table mis-hit in which there does not exist a table required for the target address translation on the table area, the required table must be generated again. Therefore, as is the case with video data or voice data reading, a case in which real time use is required is problematic. Namely, the penalty during table mis-hit is great. In order to avoid this, it is considered that all tables are held in the table area, however, the storage capacity of a volatile memory is significantly increased. In contrast, according to the present invention, all address translation tables are provided in the non-volatile memory. Thus, even if a table mis-hit occurs, the required address translation table is copied from the non-volatile memory to the table area of the volatile memory, thereby making it possible to perform address translation processing speedily, the penalty during table mis-hit is reduced. Therefore, in the present invention, even if a volatile memory with its small capacity is employed, namely, even if a table area of its sufficient size cannot be allocated, it becomes possible to reduce the penalty during table mis-hit, and application to real time use can be achieved. In the present invention, it is required to allocate an area for storing all address translation tables on the non-volatile memory. However, the capacity of the non-volatile memory is extremely larger than that of the volatile memory, which is not problematic unlike a configuration in which all tables are placed on the volatile memory.

Logical addresses are provided, each including a logical block address which has a specific field. Like the conventional ones, the non-volatile memory comprises a plurality of blocks to which the logical block addresses are allocated. The address translation tables, the determining means, and the translating means may be configured as follows.

Each address translation table is provided for a group of blocks provided on the memory. Each group of blocks corresponds to a range of logical addresses. The same data item is contained in the specific fields of the logical block addresses included in the logical addresses of any group. The data item designates the group of blocks, which corresponds to the range of logical addresses.

Each address translation table has a group of entries that can be designated by the logic block addresses allocated to the blocks of the group corresponding to the group of entries. Each entry is provided for registering physical address information that represents a location in the non-volatile memory.

The determining means determines whether an address translation table exists on the non-volatile memory, the address translation table corresponding to the range of logical addresses which is designated by the data item contained in the specific field of the logical block address included in the given logical address.

The translating means refers to the corresponding entry in the address translation table provided on the volatile memory in accordance with the logical block addresses contained in the given logical address, thereby translating the logical address to a corresponding physical address. More specifically, the translating means translates the logical address to physical address immediately if the determining means determines that an address translation table exists on the volatile memory. If the determining means determines that no address translation table exists on the volatile memory, the translating means translates the logical address to a corresponding physical address after the copying means has copying the address translation table onto the volatile memory.

It is desirable to use a rewritable non-volatile memory as the non-volatile memory. In this case, only empty address translation tables are first provided without presetting the contents of each entry in each of the address translation tables, and then, a configuration in which the contents of entries are set as required may be applied. In this configuration, registering means is provided. When physical address information is not registered in address translation table entry referred to by the translating means, the registering means searches for an empty block on the non-volatile memory, and allocates the logical block address in the given logical address to the block. Then, physical address information of the block is written into the entry referred to and the corresponding entry in the address translation table on the non-volatile memory. In this manner, the information on entries in the address translation table, corresponding to blocks which may be used infrequently can be eliminated from being registered.

In addition, when a block error occurs as a result of writing into the non-volatile memory employing a physical address translated by the translating means, the substituting means is added so as to correct the block error. This substituting means searches for an empty block on the non-volatile memory, and allocates the logical block address in the given logical address to the block. The substituting means updates the entry referred to and the corresponding entry in the address translation table on the non-volatile memory based on the physical address information on the block. In this manner, even if a block error occurs during writing, block substituting processing can be performed reliably.

In the present invention, the non-volatile memory can be managed in units of zones each consisting of group of blocks to which logical block addresses are allocated, respectively, which belong to a logical address range and which have each a specific field containing the same data item. In this case, one of the zones has been allocated to a system area in which system management information is to be stored. In this configuration, each of these address translation tables is stored in any one block in the corresponding zone of the non-volatile memory, and the copying means may include the following first and second copy functions. The first copy function is directed to a function for, during startup of the memory system, copying into the address translation table area of the non-volatile memory an address translation table stored in at least one zone other than a zone allocated to the system area of each of the zones of the non-volatile memory and an address translation table stored in the zone allocated to the system area. The second copy function is directed to a function for, when it is determined by the determining means that the corresponding address translation table does not exist on the non-volatile memory, replacing any one address translation table other than the address translation table corresponding to the system area with the corresponding address translation table. In such configuration, the address translation table corresponding to the system area can reside in a volatile memory. Thus, even if the storage capacity of the non-volatile memory increases, while an increase in the capacity of the volatile memory is prevented, an occurrence of a table mis-hit is always restrained for an access request for a frequently accessed system area, whereby fast address translation can be achieved. In addition, a penalty in the case of a table mis-hit is reduced to the minimum for an access request for an area other than system area, thereby making it possible to cope with real time use.

If the non-volatile memory is managed in units of zones, the redundant sections of the sectors constituting each block may include flag fields storing flag information. The flag information indicates one of three use states of the blocks. In the first state, the blocks are used to store a valid address translation table. In the second state, the blocks are used to store an invalidated address translation table. In the third state, the blocks are used to store valid data other than an address translation table.

In addition, in a configuration in which the aforementioned non-volatile memory is managed in units of zones, allocating means, registering means, and update means are provided. In the allocating means, when physical address information is not registered in an entry of the address translation table on the volatile memory referred to by the translating means, an empty block is searched for a zone in which the address translation table on the non-volatile memory corresponding to the table is stored, and a logical block address included in the given logical address is allocated to the block. In the registering means, physical address information on a block to which a logical block address is allocated by the allocating means is written into an entry of the address translation table on the volatile memory referred to by the translating means. In the update means, an empty block is searched for in a zone in which stored the address translation table on the non-volatile memory corresponding to the address translation table on the volatile memory referred to by the translating means is stored. Then, the address translation table in which physical address information has been written by the registering means is written in a predetermined area in the block. The update means sets flag information indicating the first state, in the flag field of the redundant section of each sector provided in the predetermined area in which an address translation table has been written. The update means sets the flag information indicating the second state in the flag field of the redundant section of one sector provided in the predetermined area in which an address translation table has been written, this address translation table corresponding to the address translation table and provided on the non-volatile memory. In such configuration, writing into the same block can be prevented from being concentrated.

In addition, in a configuration in which the aforementioned non-volatile memory is managed in units of zones, in addition to the allocating means, the registering means and the update means, there is provided detecting means and substituting means. In the substituting means, when an occurrence of a block error is detected by the detecting means, an empty block is searched for in the same manner as that in the update means, and a logical block address in the given logical address is allocated to the block. Then, the entry referred to in the address translation table on the above volatile memory is updated based on physical address information of the block. When the entry referred to in the address translation table on the volatile memory is updated by the substituting means, in the update means, an empty block is searched for, and the address translation table in which the entry referred to has been updated is written into a predetermine area in the block. In the update means, flag information indicating the first state is set in the flag field of the redundant section of each sector in an area in which the address translation table has been written, and flag information indicating the second state is set in the flag field of the redundant section of each sector in an area in which the original address translation table on the non-volatile memory has been stored. In such configuration, writing into the same block can be prevented from being concentrated.

By each of the zones for the non-volatile memory, an assignment table containing flag information indicating, for each block in the zone whether the block is used may be paired with the address translation table. A pair of the assignment table and the address translation table is stored in the same block in the corresponding zone. In addition, in the volatile memory, there is allocated an assignment table area for storing the assignment table consisting of a pair of the plural address translation tables on the non-volatile memory stored in the address translation table area. Therefore, if an empty block is searched for by referring to the assignment table on this assignment table area in a predetermined direction, the frequency of writing into each block in the zone can be uniformed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 6A and 6B are flow charts for illustrating processing during access request acceptance in the present embodiment;

FIG. 8 is a block diagram showing an entire configuration of a memory card according to a second embodiment of the present invention;

DETAILED DESCRIPTION OF THE INVENTION

Hereinafter, memory cards, or memory systems according to the present invention, will be described with reference to the accompanying drawings.

First Embodiment

Figure 1:
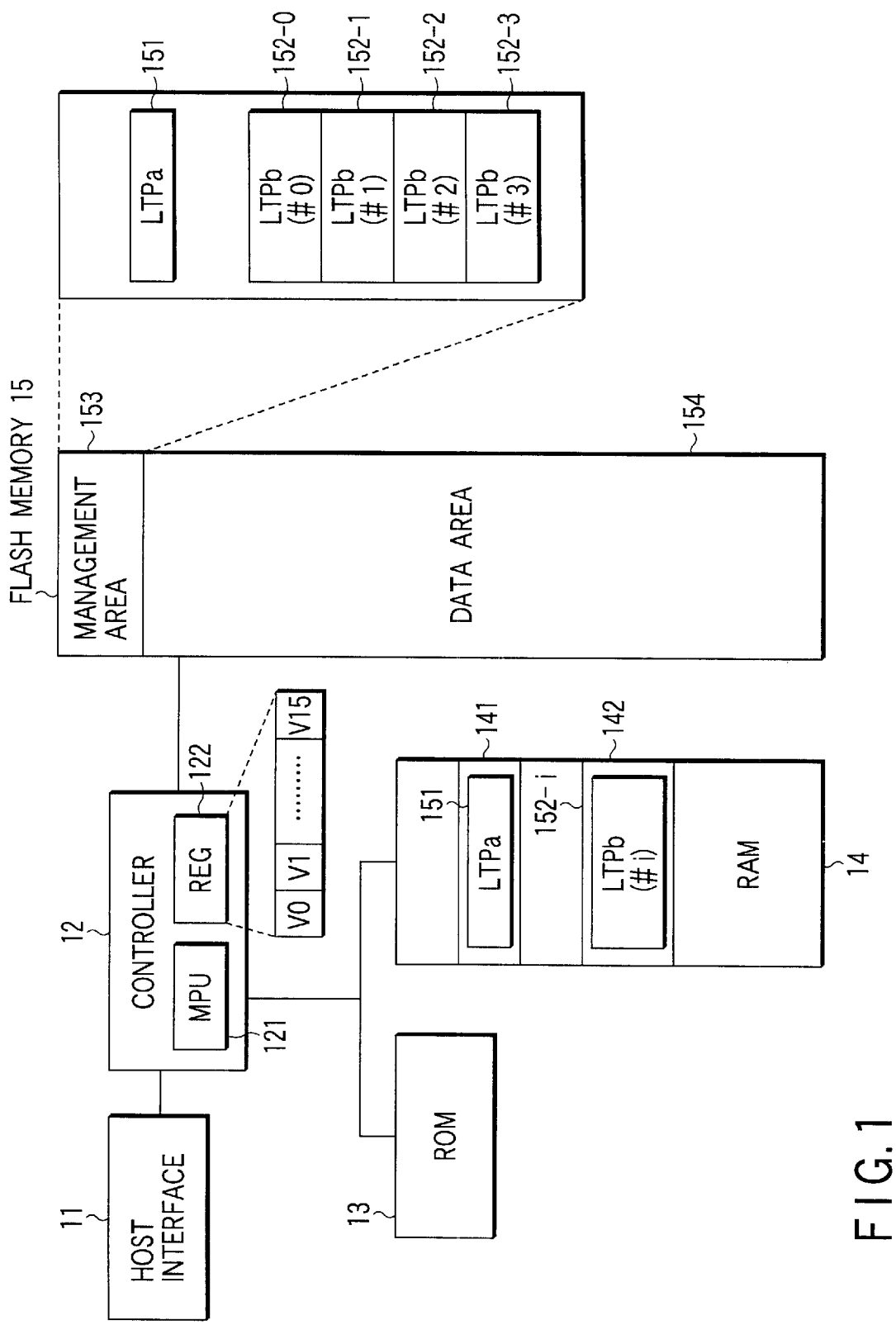
FIG. 1 is a block diagram showing an entire configuration of a memory card according to a first embodiment of the present invention.

FIG. 1 is a block diagram showing an entire configuration of a memory card according to a first embodiment of the present invention. This memory card is used by mounting the card to a variety of electronic devices including personal computer, electronic camera, and game machine. The memory card, as shown in FIG. 1, comprises a host interface 11, a controller 12, a ROM (Read Only Memory) 13, a RAM (Random Access Memory) 14, and a flash memory 15.

The host interface 11 consists of an interface with an electronic device mainframe (hereinafter, referred to as a host system) to which the memory card is mounted. The controller 12 governs the entire control of the card. The controller 12 has a microprocessor (MPU) 121 and a register (REG) 122 described later. The microprocessor 121 interprets and executes a command received via the host interface 11 in accordance with a control program (a firmware) stored in the ROM 13.

The ROM 13 is a read only non-volatile memory. The ROM 13 is employed to store the above control program and fixed management data or the like in advance. The RAM 14 is a volatile memory. The RAM 14 provides a work area (not shown) of (the microprocessor 121 in) the controller 12, an LTPa area 141, and an LTPb area 142 or the like. The LTPa area 141 is employed to store LTPa 151 described later, and the LTPb area 142 is employed to store LTPb 152-i ("i" denotes any one of 0 to 3) described later. Here, the size of the LTPb area 142 is 2 KB.

The flash memory 15 is a rewritable non-volatile memory. The flash memory 15 is a NAND flash memory, for example. An area of the flash memory 15 is allocated to a management area 153 for storing system management information or the like and a data area 154 for storing digital contents such as image data or music data. The management area 153 stores important information such as contents decoding key, copy control information, transfer control information required for using digital contents stored in the data area 154. Therefore, in the present embodiment, the management area 153 can only be accessed in accordance with the secreted specific procedure, and cannot be accessed from a host system (a user).

Figure 2A:
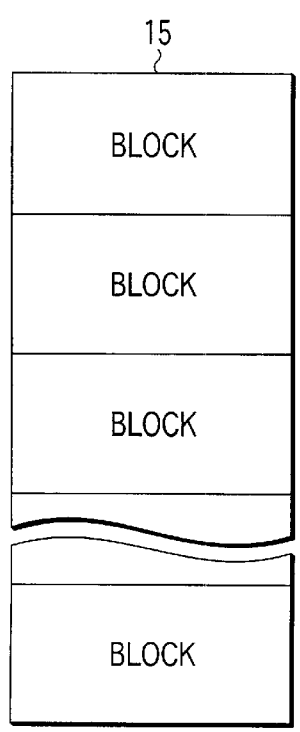
FIG. 2A is a view for illustrating blocks in a flash memory 15 shown in FIG. 1.
Figure 2B:
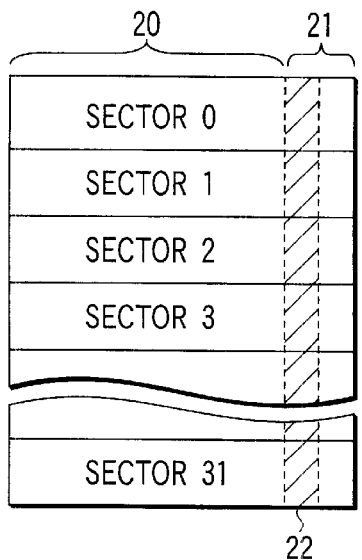
FIG. 2B is a view showing how each block shown in FIG. 2 consists of a plurality of sectors.

The flash memory 15, as shown in FIG. 2A, is composed of a plurality of blocks of a predetermined size. Data erasure is performed in units of blocks. Logical block addresses (LBAs) included in logical addresses (LAs) are allocated to in these blocks, respectively. Namely, the flash memory 15 is managed in blocks. Each block of the flash memory 15 is composed of a plurality of sectors as shown in FIG. 2B. Each sector is a minimum unit of data writing/reading for the flash memory 15. Data may be already written in a block to which a data-writing area requested for by a host system belongs. In this case, the data is read from the block. A part of the data is replaced with write data, thus generating new data. The new data is written into the block. Thus, a read-verify-write operation is performed. A data section 20 and a redundant section 21 are provided at each of the sectors as shown in FIG. 2B. The redundant section 21 includes a field (not shown) in which an error correction code (ECC) is set, and a field (LBA field) 22 in which a logical block address (LBA) allocated to a block to which the corresponding sector belongs is set.

In the present embodiment, each block of the flash memory 15, as shown in FIG. 2B, is composed of thirty-two sectors having sector addresses 0 to 31. In addition, each sector is composed of 512 bytes. Therefore, in the present embodiment, one block is composed of 16 KB. In this case, when a logical address (LA) is composed of 32 bits, the remaining 18 bits excluding the least significant 14 bits of the logical address, i.e., the significant 18 bits of the logical address represent a logical block address (hereinafter, referred to as a 18-bit logical block address) 31 allocated to the corresponding block. In addition, 5 bits following the least significant bits of the 18-bit logical block address represents a sector address 32 indicating the location of sectors in a block specified by the logical block address 31. Further, the remaining 9 bits, namely, the least significant 9 bits of the logical address represent an offset (offset address) 33 indicating the location of byte data in a sector specified by the sector address 32. However, in the present embodiment, the remaining 14 bits excluding the significant 4 bits of the 18-bit logical block address 31 are employed as a substantial logical block address (hereinafter, referred to as a 14-bit logical block address) 34. The reason is stated as follows.

First, an applicable memory card in the present embodiment restricts the maximum capacity of the flash memory 15 to 256 MB. In this case, the significant 4 bits of the 32 bit logical address for accessing the flash memory 15, namely, the significant 4 bits of the 18-bit logical block address 31 are always set to "0". Therefore, a block can be specified by the remaining 14 bits excluding the significant 4 bits of the 18-bit logical block address 31, namely, a 14-bit logical block address 34 only.

In the present embodiment, a 64 MB flash memory is used for the flash memory 15. In this case, the number of blocks in the flash memory 15 is 64 MB/16 KB=4 K=4,096 because one block is 16 KB as described above.

A pointer table (hereinafter, referred to as LTPa) 151 and $2^m$ address translation tables (hereinafter, referred to as LTPb's) 152-i (i=0 to $2^m-1$) are stored in the management area 153 of the flash memory 15. The LTPa 151 is stored in a LTPa area 141 of the RAM 14 as described above. Namely, the LTPa 151 resides in the RAM 14. In addition, any one of $2^m$ LTPb's 152-i is stored in the LTPb area 142 of the RAM 14 as described above.

The total number of entries in $2^m$ LTPb's 152-i coincides with the number of blocks in the flash memory 15. The total number of entries is 4 K (4,096) if the flash memory 15 is a 64-KB memory. In addition, the size of one LTPb 152-i is equal to the size of the LTPb area 142 that can be allocated on the RAM 14. Here, the size of the LTPb area 142 is 2 KB. Therefore, when the size of one entry for the LTPb 152-i is defined as 2 bytes, the number of entries in the LTPb 152-i that can be stored in a 2 KB LTPb area 142 is 2 KB/2 bytes=1 K (=1,024). In this case, the quantity ($2^m$) of LTPb 152-i is 4 K/1 K=4 (m=2) in the present embodiment in which the number of blocks in the flash memory 15 is 4 K (=4,096). Namely, in the present embodiment, as shown in FIG. 4A, four LTPb's 152-0 to 152-3 are stored in the management area 153 of the flash memory 15.

Here, the number of entries and the contents of entries in the LTPb 152-i will be described. In the present embodiment in which the maximum capacity of the flash memory 15 is restricted to 256 MB, the number of entries in the LTPb 152-i coincides with the number of blocks in which the value of the significant 8 bits of the 18-bit logical block address 31 (the significant 4 bits of the 14-bit logical block address 34) is "i" ("i" denotes any one of 0 to 3), i.e., $2^{10}=1,024$. That is, each of LTPb's 152-i (i=0 to 3), as shown in FIG. 4B, has 1,024 entries of entries 0 to 1,023. For each of these 1,024 entries in the LTPb 152-i, with respect to the corresponding blocks, physical address information indicating a location on the flash memory 15 of that block, for example, a physical block address in the physical address (PA) is set to be associated with the corresponding logical block address. The physical block address set in this entry is a portion excluding the sector address and the offset from among the physical address, and is employed as a pointer (a block pointer) for indicating a block.

Figure 3:
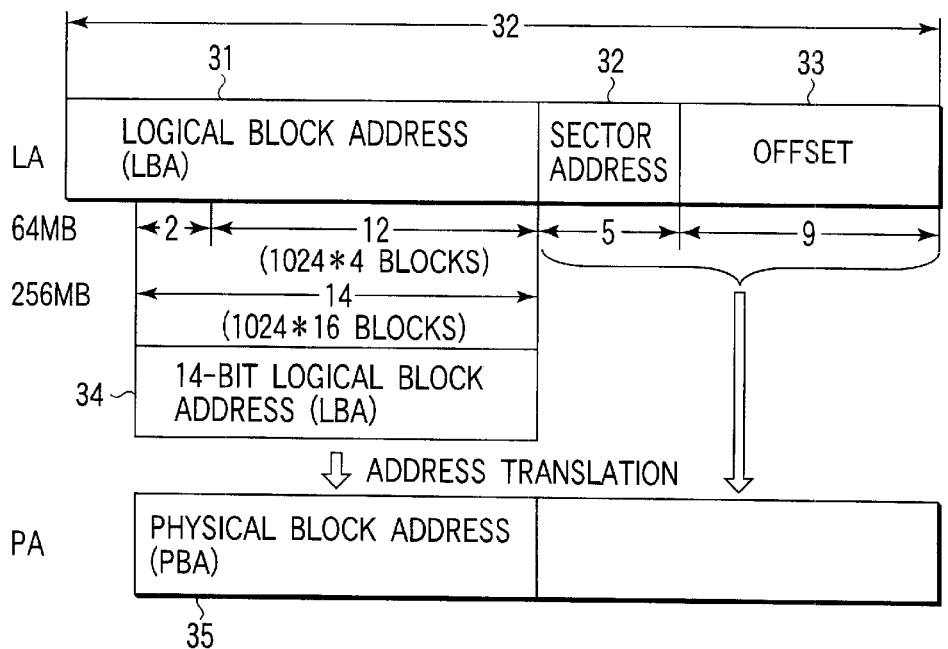
FIG. 3 is a view for illustrating a correlation between a logical address and a physical address that are applied in the above present embodiment.

By employing the LTPb 152-i, the logical address (LA) can be translated into the physical address (PA) of the flash memory 15 corresponding to the logical address. This address translation is referred to as LTP (Logical Address To Physical address translation). Specifically, reference is made to the LTPb 152-i by the 14-bit logical block address (LBA) 34 in the logical address (LA), whereby, as shown in FIG. 3, the logical block address 34 is translated into the physical block address (PBA) 35 registered in the corresponding entry in the LTPb 152-i. Then, the least significant 14 bits (14 bits consisting of the sector address 32 and the offset 33) in the logical address are linked with the least significant bits of this physical block address 35, thereby acquiring the physical address (PA) corresponding to the logical address.

Now, the number of entries and the contents of entries in LTPa 151 will be described here. The number of entries in LTPa 151 coincides with the quantity of the LTPb's 152-i stored in the flash memory 15, i.e., $2^m$. For each of $2^m$ entries in LTPa 151 (entries 0 to $2^m-1$), the physical address on the flash memory 15 at each of the start positions of $2^m$ LTPb's 152-i is set to be associated with the value of the corresponding "i". The physical address set to each entry in the LTPa 151 is employed as a pointer (LTPb pointer) for indicating the corresponding LTPb 152-i. In the present embodiment, the number of entries in the LTPa 151 is 4 in an example in which the quantity of LTPb 152-i is $2^m=4$. Therefore, reference can be made to the entry in the LTPa 151 by the least significant 2 bits of the significant 4 bits of the 14-bit logical block address 34. However, in the present embodiment, reference is made to the entry in the LTPa 151 by the value of the significant 4 bits of the 14-bit logical block address 34. This is because, when the maximum capacity of the flash memory 15 is restricted to 256 MB, and the LTPb area 142 is 2 KB, the quantity of LTPb 152-i can be a maximum of 16. Namely, if reference is made to the entry in the LTPa 151 by the value of the significant 4 bits of the 14-bit logical block address 34, even if the capacity of the flash memory 15 is 256 MB, reference can be made to the LTPa 151 in accordance with the procedure similar to a case of 64 MB. By employing this LTPa 151, information of the storage location on the flash memory 15 of the LTPb 152-i required to translate a logical address (LA) into a physical address (PA) can be acquired.

At a predetermined position, for example, at the start position of the management area 153 on the flash memory 15, the physical address PAa at the start position of the LTP 151 on the flash memory 15 is set as an LTPa pointer.

Now, an operation of the memory card in the present embodiment will be described sequentially with respect to (A1) processing during of startup and (A2) processing during access request acceptance.

(A1) Processing During Startup

Figure 5:
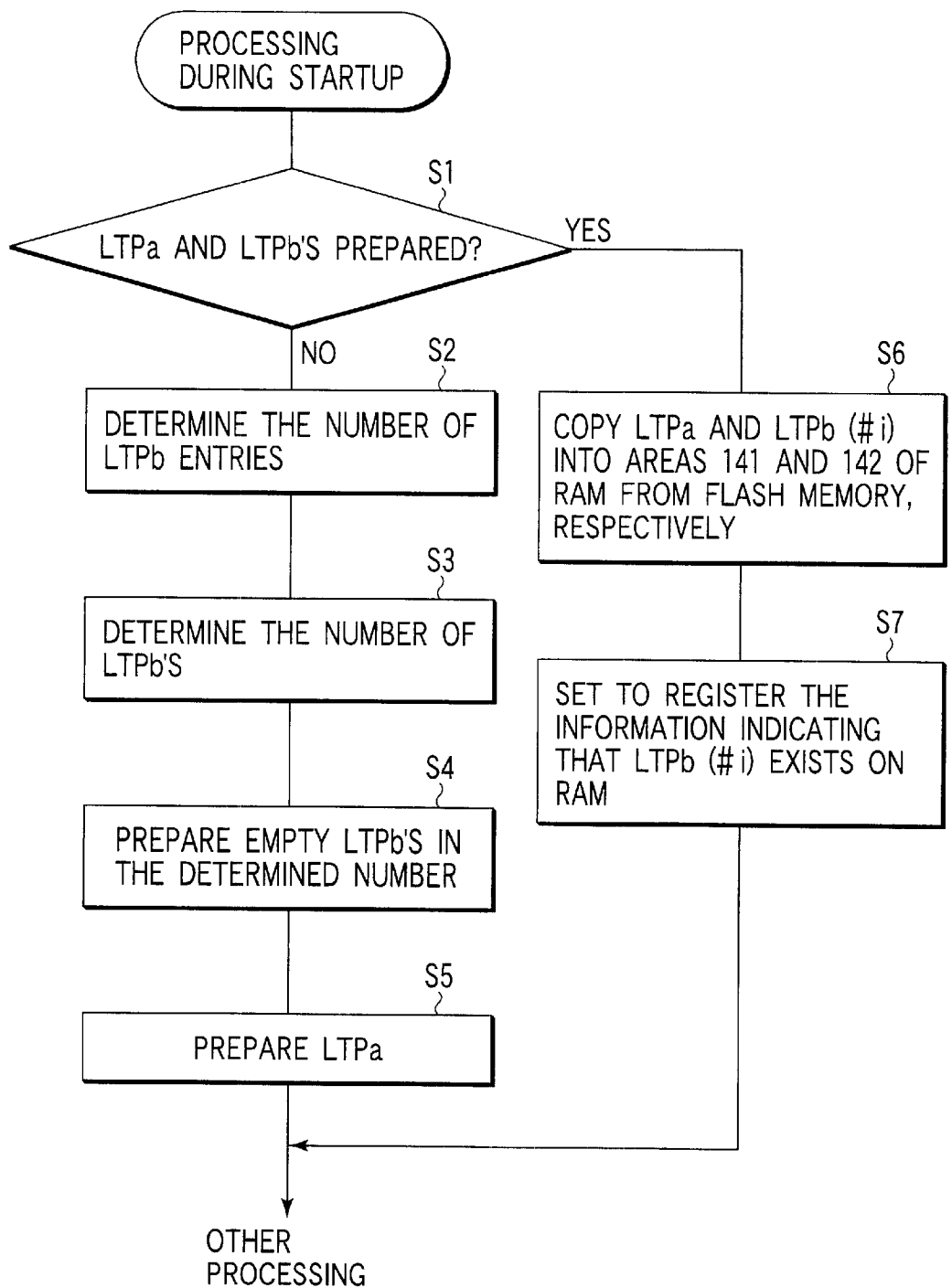
FIG. 5 is a flow chart for illustrating processing during startup in the present embodiment.

First, a description will be given to processing during memory card startup, for example, when power is turned ON with reference to the flow chart shown in FIG. 5.

When the power supply of a host system, for example, is supplied to the memory card shown in FIG. 1, the microprocessor 121 in the controller 12 determines whether or not the LTPa 151 and LTPb's 152-i are prepared on the flash memory 15 (step S1). This determination is performed by determining whether or not data is written into the start address, for example, of the flash memory 15. Here, the state of "data is written" denotes that data does not enter a erasure state in which all bits of the address location are set to "1", namely, the corresponding address location is in a non-erasure state.

When it is determined that the LTPa 151 and LTPb's 152-i are not prepared, the microprocessor 121 determined the number of entries "A" for each LTPb 152-i (step S2). The number of entries "A" in each LTPb 152-i is determined by A=B/C from the size B of the predetermined LTPb area 142 and the size C of one entry for LTPb 152-i. Here, when B=2 KB and C=2 bytes, the result is A=2 KB/2 bytes=1 K=1,024.

Then, the microprocessor 121 determines the number "D" of LTPb's 152-i (step S3). The number (=$2^m$) of LTPb's 152-i is obtained by D=E/A from the number "E" of blocks in the flash memory 15 and the number "A" of entries in each LTPb 152-i. Here, the number "E" of blocks in the flash memory 15 is computed by E=I/H from the size H of one block and capacity I of the flash memory 15. In addition, the size H of the above one block is computed by H=F * G from the number F of sectors in one block and the number G of bytes in one sector. Here, when the number F of sectors in one block is 32, and the number of bytes in one sector is 512, the size H of one block is 32 * 512=16 KB. In this case, the number E of blocks in the flash memory 15 when I=64 MB is E=I/H=64 MB/16 KB 4 K=4,096.

Figure 4:
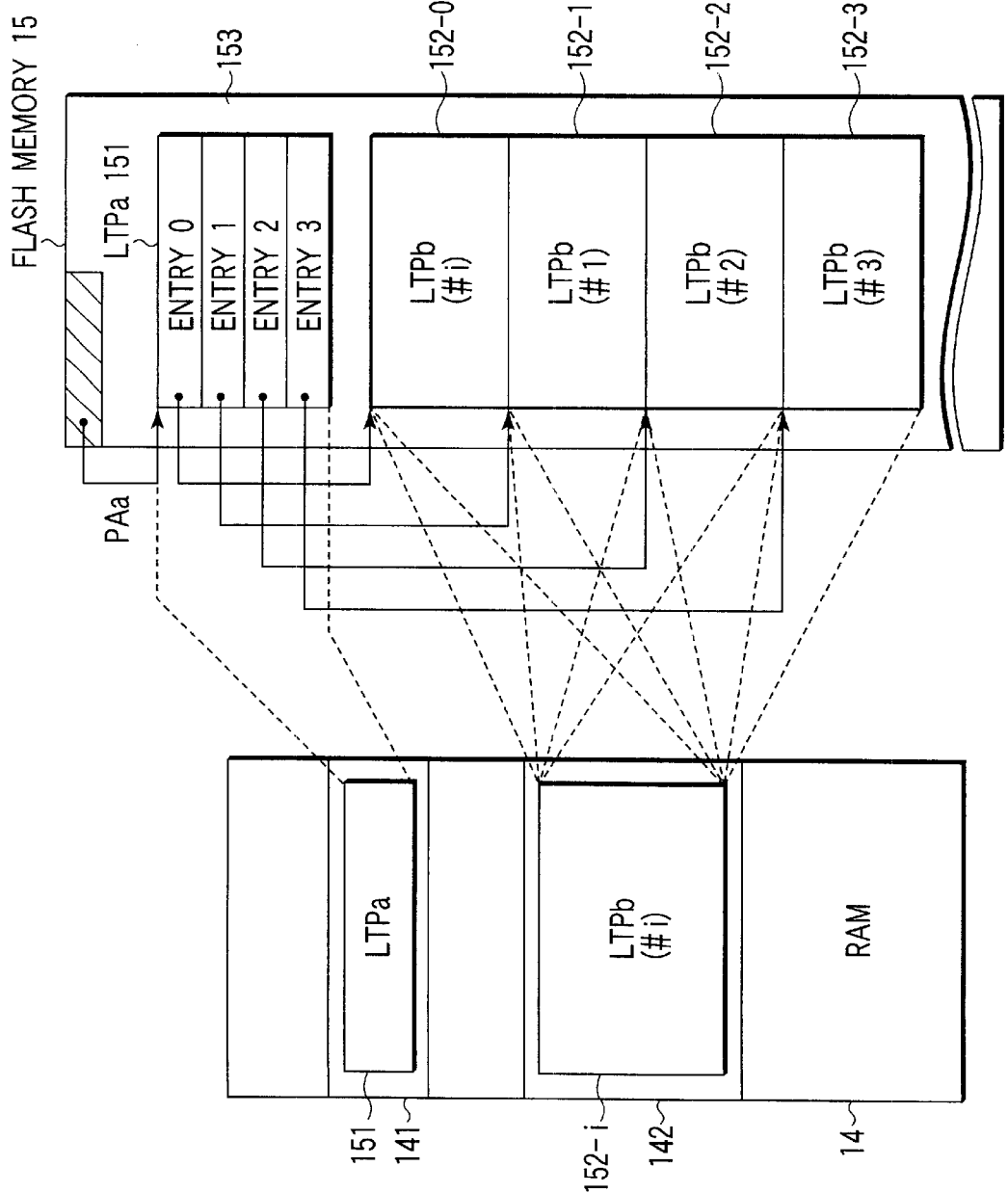
FIG. 4A is a view for illustrating LTPa 151 and LTPb 152-i applied in the present embodiment.
FIG. 4B is a view for illustrating entries in LTPb 152-i.

When the microprocessor 121 determines the quantity D of LTPb 152-i and the number A of entries for the LTPb 152-i, it goes to step S4. At step S4, the microprocessor 121 prepares empty LTPb's 152-i having entries with predetermined entry number A on the management area 153 of the flash memory 15 by the determined quantity D (step S4). Here, since A=1,024 and D=4, as shown in FIG. 4, the four empty LTPb's 152-0 to 152-3 having 1,024 in entry number is stored in the management area 153 of the flash memory 15. At this time, nothing is written in each of entries in LTPb's 152-0 to 152-3. Namely, each of the entries in LTPb's 152-0 to 152-3 is in an erasure state in which all bits are set to "1".

Then, the microprocessor 121 generates the LTPa 151 in which the number of entries is D (=4), and stores in the management area 153 of the flash memory 15 (step S5). In each entry "i" for the LTPa 151, there is registered a physical address at the start position of the storage destination on the flash memory 15 of the corresponding LTPb 152-i generated at step S4. At this time, the microprocessor 121 registers the physical address PAa at the start position of the storage destination on the flash memory 15 of the LTPa 151 in the start address position of the flash memory 15. In this manner, during the subsequent startup processing, at the step S1, it is determined that the LTPa 151 and LTPb's 152-i have been prepared. In addition, at the S5, the microprocessor 121 stores the thus prepared LTPa 151 in a LTPa area 141 of the RAM 14. If the LTPa 151 is generated on the LPTa area 141, this storage operation is eliminated.

Now, a description will be given to processing when it is determined that the LTPa 151 and LTPb's 152-i have been prepared at the step S1. In this case, the microprocessor 121 copies the LTPa 151 from the flash memory 15 to the LTPa area 141 of the RAM 14 (step S6). In addition, at step S6, the microprocessor 121 copies one of the LTPb's 152-i (for example, LTPb 152-0, one of LTPb's 152-0 to 152-3) from the flash memory 15 to the LTPb area 142 of the RAM 14 (step S6). Then, the microprocessor 121 sets in a register 122 the information indicating the LTPb 152-i copied to the LTPb area 142 of the RAM 14, namely, the information indicating that the LTPb 152-i exists on the RAM 14 (step S7). In the present embodiment, in the register 122, as shown in FIG. 1, valid flags V0 to V15 are held by 16 tables. This is because the quantity (16) of LTPb's 152-i generated when the maximum capacity of the flash memory 15 is 256 KB is taken into consideration. Only the valid flag Vi corresponding to the LTPb 152-i copied to the LTPb area 142 of the RAM 14 is set to ON (set to "1"), thereby making it possible to identify the LTPb 152-i that exists in the RAM 14. Namely, in the present embodiment, the valid flag Vi is defined as information indicating the LTPb 152-i that exists on the PAM 14.

(A2) Processing During Access Request Acceptance

Figure 6B:
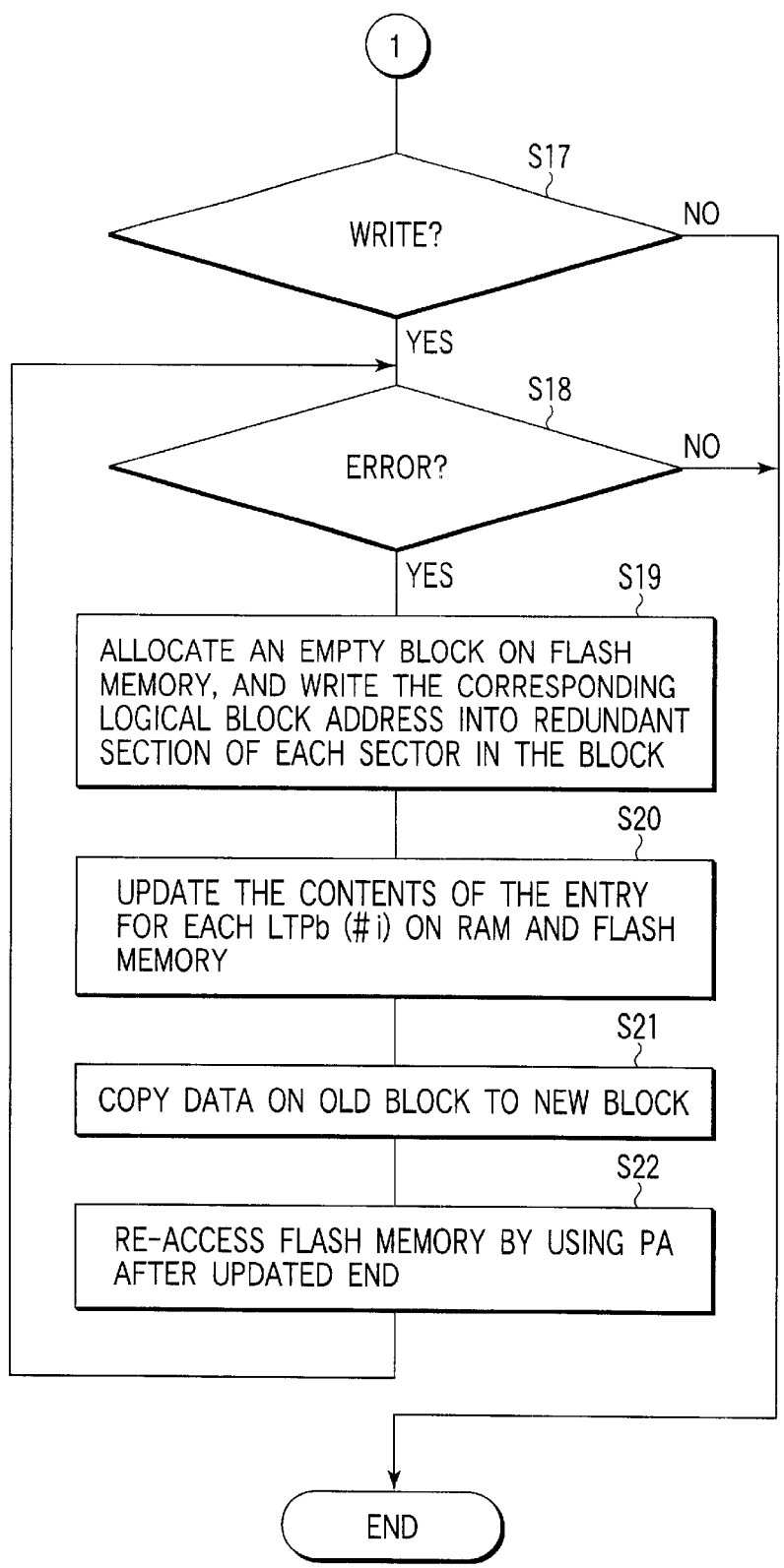
Figure 7:
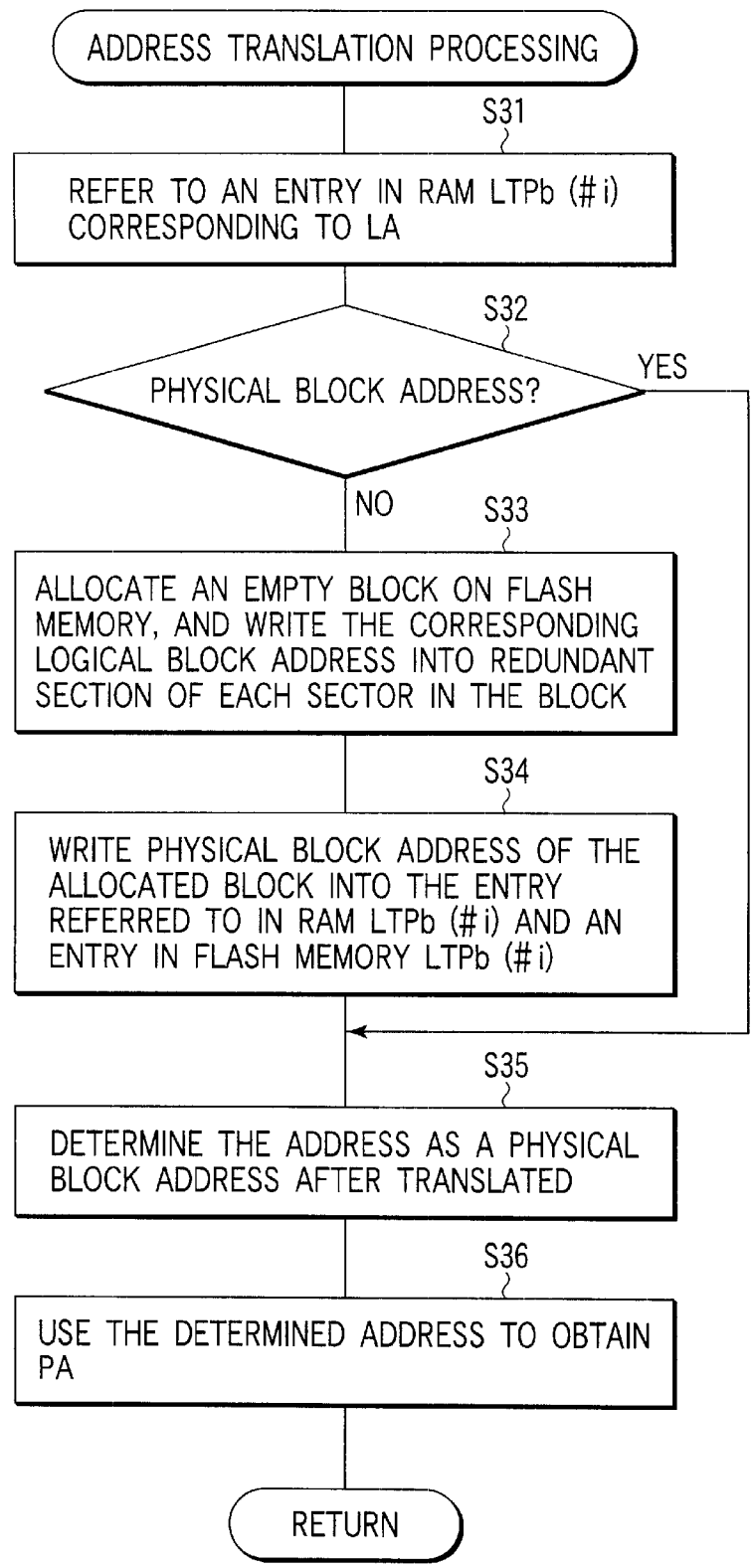
FIG. 7 is a flow chart for illustrating the detailed procedures for address translation processing at step S15 shown in FIG. 6A.

Now, a description will be given to processing when an access request from a host system to a flash memory 15 is received by the host interface 11, and is accepted by a microprocessor 121 in the memory card shown in FIG. 1, with reference to the flow charts shown in FIGS. 6A and 6B and the flow chart shown in FIG. 7.

First, access requests sent from the host system includes a command indicating either write or read access, a logical address (LA) indicating a start position of an access target area on a logical address space, and a size of the area.

The microprocessor 121 determines whether or not a logical address during an access request from the host system is within the range of a logical address space allocated to the data area 154 of the flash memory 15 (step S11). If the address is out of the above range, the microprocessor 121 notifies to the host system an error indicating an illegal access. Alternatively, when the address is within the range, the microprocessor 121 determines whether or not the LTPb 152-i corresponding to the requested logical address exists on the RAM 14 (step S12). Prior to this step S12, it is recommended that the microprocessor 121 determines whether or not an access request encompassing a plurality of blocks is made from the requested logical address and size; if the request is made, an illegal access is returned; and if not, processing goes to step S12. In the case of an access request encompassing a plurality of blocks, the access request is translated into the access request for each block, whereby the thus translated access request is internally processed as a plurality of access requests.

Now, a determining method at the step S12 will be described here. First, the microprocessor 121 makes reference to an valid flag Vi in the register 122 specified by the value "i" of the significant 4 bits of the 14-bit logical block address 34 in the requested logical address. Then, the microprocessor 121 determines whether or not the LTPb 152-i corresponding to the requested logical address exists on the RAM 14 in accordance with to whether or not the referenced valid flag Vi is in an ON state. A selector for selecting the corresponding valid flag Vi based on the value "i" of the significant 4 bits of the 14-bit logical block address 34 is provided, whereby the above determination may be performed in accordance with a logical state of this selector output.

When it is determined that the LTPb 152-i corresponding to the requested logical address does not exist on the RAM 14, the microprocessor 121 copies the LTPb 152-i from the flash memory 15 to the LTPb area 142 of the RAM 14 (step S13). In this manner, the LTPb on the LTPb area 142 of the RAM 14 is replaced with the LTPb 152-i corresponding to the requested logical address. The physical address at the start position of an area on the flash memory 15 in which the LTPb 152-i is stored can be acquired by referring to the corresponding entry "i" of the LTPa 151 stored in the LTPa area 141 of the RAM 14 in accordance with the value "i" of the significant 4 bits of the 14-bit logical block address 34 in the requested logical address.

When step S13 is executed, the microprocessor 121 set a valid flag Vi to ON in the register 122 specified by the value "i" of the significant 4 bits of the 14-bit logical block address 34 in the requested logical address. At this time, when another valid flag that is already in an ON state exists, the valid flag is set to OFF.

When it is determined that the LTPb 152-i corresponding to the requested logical address does not exist on the RAM 14, the microprocessor 121 goes to step S15 after the steps S13 and S14 have been executed. Otherwise, the microprocessor goes to step S15. At step S15, the microprocessor 121 performs address translation processing for translating the requested logical address into a physical address by utilizing the LTPb 152-i on the LTPb area 142.

Hereinafter, the address translation processing at step S15 will be described in detail with reference to the flow chart shown in FIG. 7. First, the microprocessor 121 makes reference to the corresponding entry in the LTPb 152-i placed on the LTPn area 142 of the RAM 14 in accordance with the 14-bit logical block address 34 in the requested logical address (LA) (step S31). Then, the microprocessor 121 determines whether or not physical address information of a block specified by the 14-bit logical block address 34 is set to the entry in accordance with whether or not data is written into the entry referred to, namely, in accordance with whether or not the entry are in a non-erasure state (step S32). In the present embodiment, the physical address information registered in each entry in the LTPb 152-i is a physical block address excluding the least significant 14 bits of the physical address. 14-bit data on which all bits are set to "0" is linked with the least significant bits of this physical block address, whereby the start physical address of the corresponding block is obtained. Thus, a physical address is substantially registered as physical address information in each entry in the LTPb 152-i. Therefore, the step S32 is equivalent to determining whether or not the physical address (PA) is set in the entry referred to.

When no physical address information (physical block address) is set in the entry referred to, the microprocessor 121 goes to step S33. At step S33, the microprocessor 121 secures one empty block from the data area 154 of the flash memory 15. The empty block used here is referred to as a block in which a logical block address is not written at the redundant section 21 (LBA field 22) of each sector in the block. When the microprocessor 121 secures an empty block, the microprocessor writes a logical block address in the requested logical address into the redundant section 21 (LBA field 22) of each sector in the block. In this manner, a logical block address in the requested logical address is allocated to the secured empty block. Then, the microprocessor 121 writes the 14 bit physical block address in the start physical address of a block secured at step S33 and having a logical block address allocated thereto into the entry referred to in the LTPb 152-i placed on the LTPb area 142 of the RAM 14 and the entry in the LTPb 152-i stored in the flash memory 15 corresponding to the entry referred to (step S34). Then, the microprocessor 121 goes to step S35. At this step S35, the physical block address newly written at step S34 is acquired as a physical block address 35 corresponding to the 14-bit logical block address 34 in the requested logical address.

In contrast, when a physical block address is set in the referenced entry, the microprocessor 121 goes to step S35. At the step S35, the physical block address is acquired as a physical block address 35 corresponding to the 14-bit block address 34 in the requested logical address.

Then, in the microprocessor 121, the least significant 14 bits of the requested logical address (LA), i.e., 14 bits consisting of a 5-bit sector address 32 and a 9-bit offset 33 are linked with the least significant bits of the physical block address 35 acquired at the step S35, thereby acquiring a target physical address (PA) (step S36). The address translation processing at step S15 at which the requested logical address (LA) is translated into a physical address (PA) is ended by the above procedure. In the case where there is applied a configuration in which a physical address having all of the least significant 14 bits set to "0" is acquired, the least significant 14 bits of the requested logical address are added to the physical address, whereby a target physical address (PA) can be acquired.

When the microprocessor 121 goes to step S16 when the physical address (PA) of the flush memory 15 corresponding to the requested logical address (LA) is acquired during address translation processing at step S15. At step S16, the microprocessor 121 accesses the flash memory 15 by employing the acquired physical address (PA), and performs the requested writing or reading targeted for an area by the requested size started from a position specified the physical address (PA). Here, at the time of a read access, the read data is transferred to the host system via the host interface 11.

Then, the microprocessor 121 determines whether a write or read access is provided (step S17). In the case of read access, a series of processes during access request acceptance is ended. In contrast, in the case of write access, the microprocessor 121 determines whether or not a write error occurs (step S18). This determination is performed by comparing the read data with the original write data. As is evident, when the comparison result indicates non-coincidence, it is determined as a write error.

When no write error occurs, the microprocessor 121 terminates a series of processes during access request acceptance. Alternatively, when a write error occurs, the microprocessor 121 determines that the entire block including a sector at which the write error occurs is fault, namely, determines that a block error occurs, and performs processing for substituting another empty block for the fault entire block as follows.

First, the microprocessor 121 secures one empty block as a substituting block from the flash memory 15, and writes a logical block address in the requested logical address into the redundant section 21 (LBA field 22) of the empty block (step S19).

Then, in the microprocessor 121, both of the entry referred to in the LTP 152-i placed on the LTPb area of the RAM 14 and an entry in the LTPb 152-i stored in the flash memory 15 and corresponding to the entry referred to, i.e., the contents of both of these entries specified by the 14-bit logical block address 34 in the requested logical address are updated to a physical block address in the physical address at the start position of the above allocated substituting block (in which a logical block address has been allocated) (step S20). Then, the microprocessor 121 copies data on an old block determined as a block error to the substituting block (step S21). The microprocessor 121 re-accesses the flash memory 15 by employing a physical address (PA) acquired from the physical block address updated at the step S20, and performs the requested writing targeted for an area corresponding to the requested size starting from the position in the substituting block specified by the physical address (PA) (steep S22).

When writing is normally performed by this re-access, a series of processes during access request acceptance is ended. In contrast, when a write error reoccurs, the block substituting process at the step S19 or later and the rewriting process targeted for the substituting block are performed. If writing cannot be performed normally after the above processes have been repeated in predetermined number, the processes terminate in erroneous state.

In the present embodiment, empty LTPb's 152-i are prepared when the memory card is initialized. Alternatively, LTPb 152-i having the contents of entries may be prepared at the time of initializing the memory card.

Second Embodiment

FIG. 8 is a block diagram showing an entire configuration of a memory card according to a second embodiment of the present invention. Hereinafter, the configuration of the memory card shown in FIG. 8 will be described, focusing on points which differ from the memory card shown in FIG. 1. The memory card shown in FIG. 8 comprises a host interface 41, a controller 42, a ROM 43, a RAM 44, and a flash memory 45 corresponding to the host interface 11, the controller 12, the ROM 13, the RAM 14, and the flash memory 15 shown in FIG. 1, respectively.

An area for the flash memory 45 is managed in units of blocks in the same way as the flash memory 15 shown in FIG. 1. The capacity of the flash memory 45 and the number of blocks thereof are the same as those of the flash memory 15. The number of sectors configuring each block of the flash memory 45 and the number of bytes configuring these sectors in the flash memory 45 are the same as those in the flash memory 15. Like the flash memory 15, the flash memory 45 is managed in units of blocks. The flash memory 45 differs from the flash memory 15 in that it is managed in units of zones 454-i (i=0 to $2^m$-i, where m=2), each consisting of a group of blocks to which logical block addresses are allocated, respectively, which belong to a logical address range and which have each a specific field containing the same data item. One of $2^m$ zones 454-i, for example, a zone 454-0 is allocated to a system area including a management area 453 in which system management information or the like is stored. An area other than the management area 453 of the flash memory 45 is employed as a data area for storing digital contents such as image data or music data.

In $2^m$ zones 454-i of the flash memory 45, there is stored in advance LTPb's 452-i (i=0 to $2^m$-1) for translating a logical block address (LBA) allocated to each block configuring the zones 454-i into a physical block address (PBA) of the block. Clearly, a total number $2^m$ of the zones 454-i coincides with a total number of LTPb's 452-i. An assignment table (hereinafter, referred to as AT) 455-i is stored in advance in each zone 454-i of the flash memory 45 with paired with LTPb 452-i.

The RAM 44 provides an LTPa area 441 for storing LTPa 451 corresponding to LTPa 151 shown in FIG. 1, an LTPb area 442 for storing any one of LTPb's 452-i other than LTPb 452-0 of the $2^m$ LTPb's 452-i, and an LTPb area 443 for storing LTPb 452-0. The RAM 44 also provides an AT area 444 for storing AT 455-i paired with LTPb 452-i stored in the LTPb area 442, and an AT area 445 for storing AT 455-0 paired with LTPb 452-0 stored in the LTPb area 443.

Figures 9A, 9B:
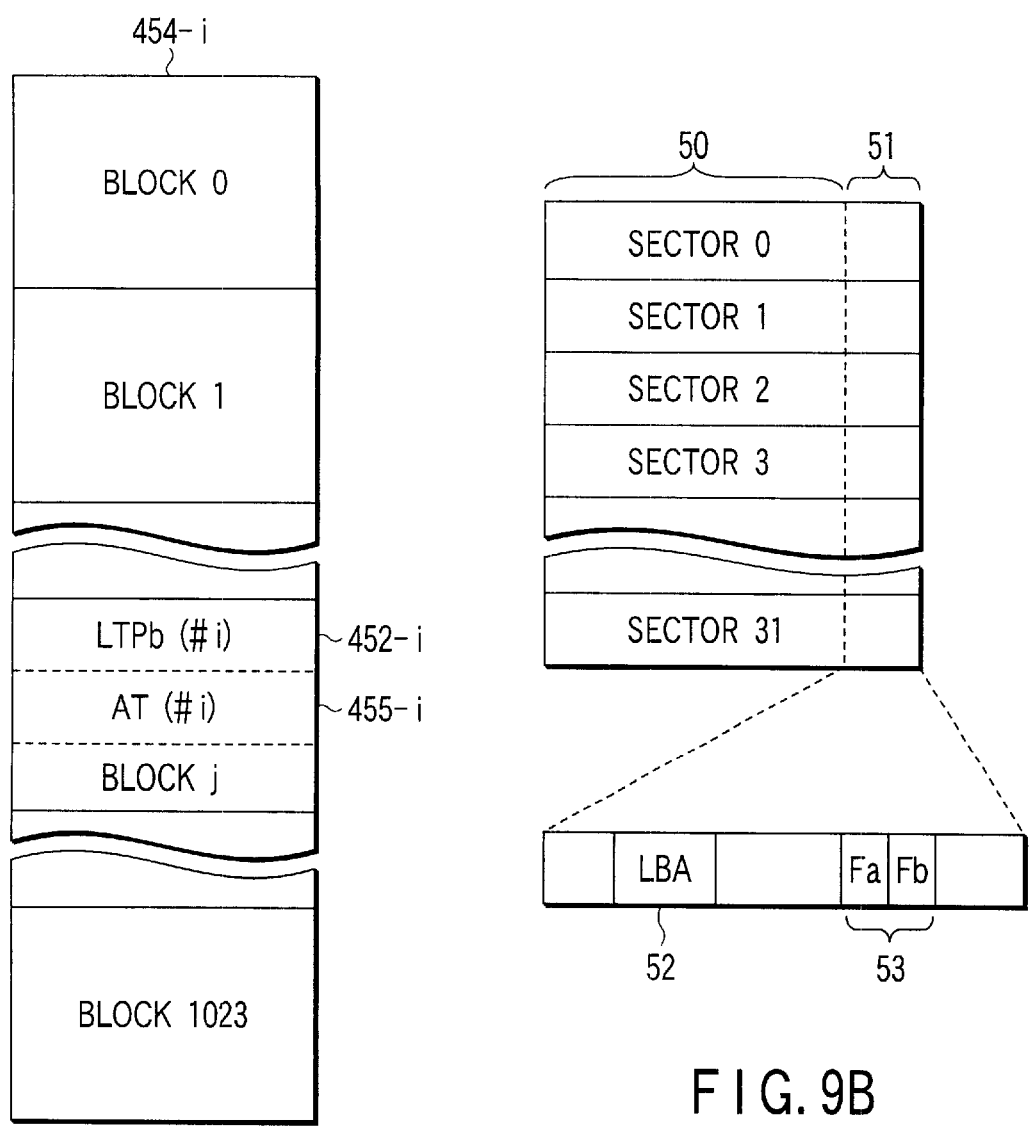
FIG. 9A is a view illustrating a storage location of a pair of LTPb 452-i and AT455-i stored by each zone 454-i of a flash memory 45 shown in FIG. 8.
FIG. 9B is a view showing an example of a data structure of the redundant section of each sector configuring a block, the data structure being applied in the second embodiment.

A total number of entries in $2^m$ LTPb's 452-i coincides with a total number of blocks provided in the flash memory 45, which is 4 K (4,096) in an example when the flash memory 45 is 64 MB. In addition, the size of one LTPb 452-i is equal to that of each of the LTPb areas 442 and 443 that can be allocated onto the RAM 44. Here, the sizes of the LTPb areas 442 and 443 each are 2 KB. Therefore, when the size of each entry in LTPb 452-i is 2 bytes, the number of entries for LTPb 452 that can be stored in the 2 KB LTPb areas 442 and 443 is 2 KB/2 bytes=1 K (=1,024). The number of blocks constituting the zone 454-i coincides with the number of LTPb 452-i entries 1K (=1,024). The number of LTPb's 452-i ($2^m$) is 4 K/1 K=4 (m=2), if the number of blocks provided in the flash memory 45 is 4 K (4,096). Namely, in the present embodiment, as shown in FIG. 8, four LTPb's 452-0 to 452-3 are paired with ATs 455-0 to 455-3, and are stored to be dispersed into zones 454-0 to 454-3 of the flash memory 45. Here, a pair of LTPb 452-i (i=0 to 3) and AT 455-i is stored in a predetermined area, for example, a first area of any one block 'j' of 1,024 blocks (blocks 0 to 1023) in the zone 454-i, as shown in FIG. 9A. Information other than LTPb 452-i and AT 455-i is controlled so as not to be stored in the block 'j' in which LTPb 452-i and AT 455-i are stored.

Figures 10, 11:
FIG. 10 is a view showing an example of a relationship between a combination of states of the flags Fa and Fb in the redundant section, the configuration being applied in the second embodiment, and a use state of a block to which the corresponding sector defied by the combination belongs.
FIG. 11 is a view showing an example of a data structure of the AT 455-i.

Another redundant section 51 other than data section 50 is provided at each sector in the above block, as shown in FIG. 9B. This redundant section 51 contains a field (not shown) in which ECC is set, an LBA field 52, and a flag field 53 in which two types of flags Fa and Fb are set. The flags Fa and Fb indicate that a block to which the corresponding sector belongs when Fa=1 and Fb=1 is inactive or invalid. When Fa=1 and Fb=0, these flags indicate that the block is employed for storing valid data other than LTPb 452-i. In addition, the flags Fa and Fb indicate that a block to which the corresponding sector belongs when Fa=0 and Fb=1 is currently employed for storing LTPb 452-i. When Fa=0 and Fb=0, these flags indicate that the block is employed for storing old LTPb 452-i, i.e., invalidated LTPb 452-i. FIG. 10 shows an example of a relationship between a combination of the states of these flags Fa and Fb and a use state of a block to which the corresponding sector defined in the combination belong.

AT 455-i is composed of flags F0 to F1023 indicating whether or not blocks (blocks 0 to 1023) of the corresponding zone 454-i are used, as shown in FIG. 11. Here, Fj (j=0 to 1023) indicates that a block 'j' is used when Fj=0. When Fj=1, it indicates that a block 'j' is not used, namely, that the block 'j' is an empty block. A pointer (flag pointer) P is added to AT 455-i, as shown in FIG. 11. This pointer P indicates the position of one flag Fj in AT 455-i, for example, the position of the most recently referred flag Fj.

Now, operations in the memory card configured in FIG. 8, i.e., processing during startup (B1) and processing during access request acceptance (B2) will be described sequentially.

(B1) Processing During Startup

Figure 12:
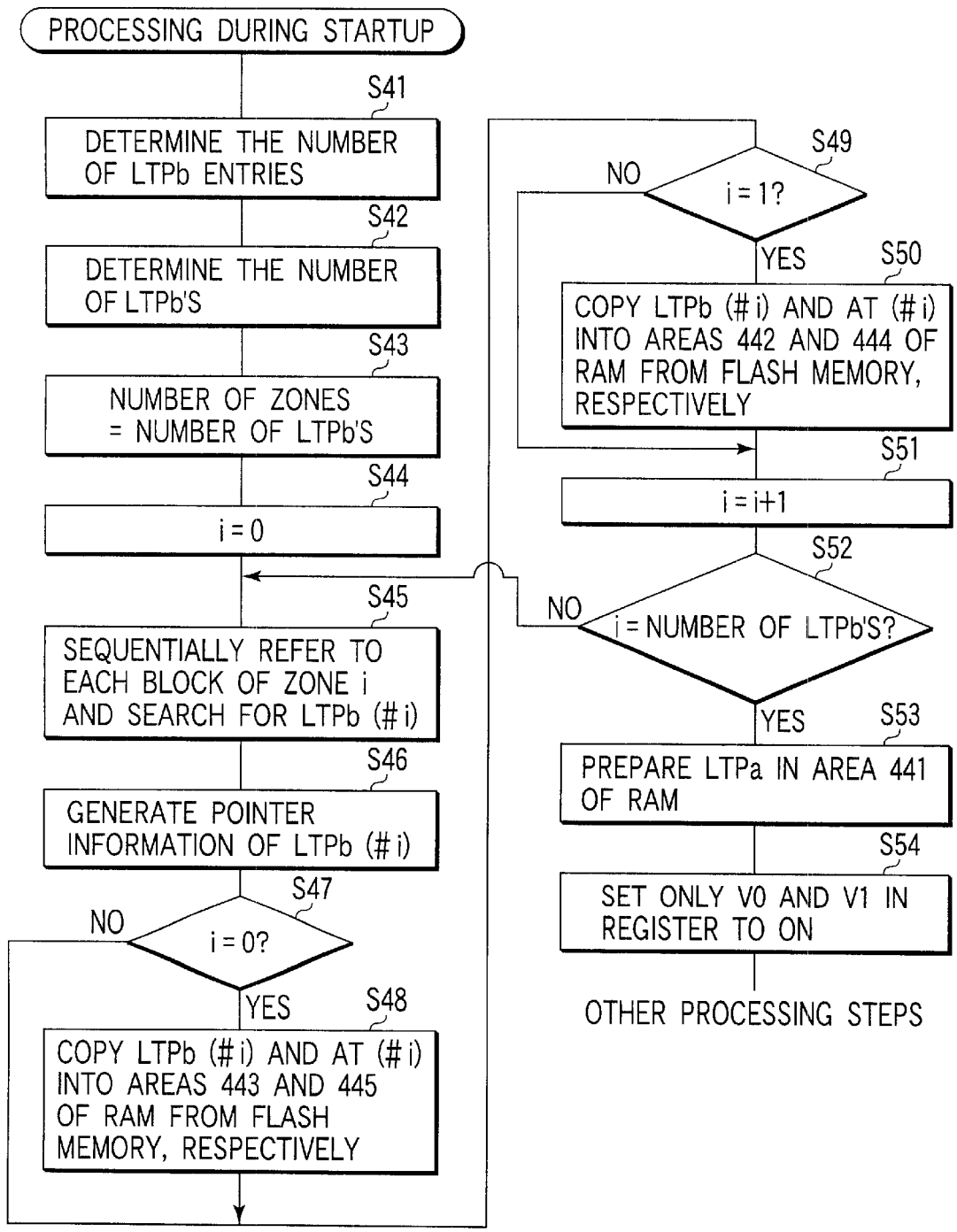
FIG. 12 is a flowchart for illustrating processing during startup of the memory card in the second embodiment.

First, processing during startup of the memory card shown in FIG. 8, for example, processing when the power is turned ON will be described with reference to the flowchart shown in FIG. 12.

A microprocessor 421 in a controller 42 determines the number A of entries for LTPb 452-i stored in the flash memory 45 when the power of a host system, for example, is supplied to the memory card shown in FIG. 8 (step S41). The number A of entries for this LTPb 452-i is determined by A=B/C from a size B of the predetermined LTPb areas 442 and 443 and a size C of one entry for LTPb 452-i. Here, when B=2 KB and C=2 bytes, the result is A=2 KB/2 bytes=1 K=1,024.

Next, the microprocessor 421 determines the number D of LTPb's 452-i (step S42). The number D (=$2^m$) of LTPb's 452-i is determined by D=E/A from a total number E of blocks in the flash memory 45 and the number A of entries for LTPb 452-i. Here, the number E of blocks in the flash memory 45 is computed by E=I/H from a size H of one block and a capacity I of the flash memory 45. In addition, the size H of one block is computed by H=F * G from the number F of sectors in one block and the number G of bytes in one sector. Here, assuming that the number F of sectors in one block is 32, and the number of bytes in one sector is 512, the size H of one block is 32 * 512=16 KB. In this case, the number E of blocks in the flash memory 45 with I=64 MB is E=I/H=64 MB/16 KB=4K =4,096.

Next, the microprocessor 421 determines the number D of LTPb 452-i, and then, defines the number D as the number of zones in the flash memory 45 (step S43). Here, when A=1,024 and D=4, four LTPb's 452-0 to 452-3, each with 1,024 entries, are stored in advance to be dispersed into four zones 454-0 to 454-3, respectively. However, nothing is written into entries for LTPb's 452-0 to 452-3 before the flash memory 45 is used.

Next, the microprocessor 421 set a variable 'i' for specifying a zone 454-i (and LTPb 452-i) to an initial value 0 (step S44). Then, the microprocessor 421 searches for LTPb 452-i by sequentially referring to the blocks of the zone 454-i specified by the variable 'i' (step S45). The processing of this step S45 is achieved by searching for a block 'j' ('j' denotes any one of 0 to 1023) in which the flags Fa and Fb set at the redundant section 51 of the start sector of the blocks of the zone 454-i are 0 and 1, i.e., a sector indicating that a valid LTPb 452-i is stored.

The microprocessor 421 searches for a block 'j' in which LTPb 452-i is stored, and generates pointer information (LTPb pointer) indicating a storage location (a start physical address) on the flash memory 45 of LTPb 452-i that is determined depending on the location on the flash memory 45 of that block 'j' (step S46). Then, the microprocessor 421 determines whether or not the variable 'i' is 0 (step S47). If the variable 'i' is 0, as shown in this example, the microprocessor 421 copies to the areas 443 and 445 of the RAM 44 LTPb 452-0 and AT 455-0 on the flash memory 45, i.e., LTPb 452-0 and AT 455-0 on the zone 454-0 allocated to the system area (step S48), and proceeds to step S49. In contrast, if the variable 'i' is not 0, the microprocessor 421 proceeds to step S49.

At step S49, the microprocessor 421 determines whether or not the variable 'i' is 1. If the variable 'i' is 1, the microprocessor 421 copies, to the areas 442 and 444 of the RAM 44, LTPb 452-1 and AT 455-1 stored in the zone 454-1 of the flash memory 45 (step S50), respectively, and proceeds to step S51. If LTPb and AT copied to the areas 422 and 444 are LTPb and AT other than LTPb 452-0 and AT 455-0 stored in the zone 454-0 allocated to the system area, LTPb and AT may be, for example, LTPb 452-2 and AT 455-2, or LTPb 452-3 and AT 455-3. In contrast, when the variable 'i' is not 1, the microprocessor 421 proceeds to step S51. After executing the step S48, the microprocessor 421 may proceed to step S51.

Next, at step S51, the microprocessor 421 increments the variable 'i' by one. Then, the microprocessor 421 determines whether or not the variable 'i' after incremented coincides with the number D of LTPb (here, 4) (step S52). If the variable 'i' after incremented does not coincide with the number D of LTPb, the microprocessor 421 performs processing of step S45 or subsequent. In contrast, if the variable 'i' after incremented coincides with the number D of LTPb, the microprocessor 421 determines that pointer information of all LTPb's 452-i (here, LTPb 452-0 to 254-3) is generated. In this case, the microprocessor 421 generates LTPa 451 consisting of a group of entries in which pointer information of all LTPb's 452-i is set, and stores that LTPs 451 in the LTPa area 441 of the RAM 44. If the pointer information of each LTPb 452-i is generated while the generating position is shifted on the LTPa area 441, the processing of step S53 is eliminated.

Next, the microprocessor 421 sets to a register 422 the information indicating that LTPb's 452-0 and 452-1 are copied to the LTPb areas 443 and 442 of the RAM 44, respectively (step S54). In the present embodiment, valid flags V0 to V15 for 16 tables are held in the register 422, as shown in FIG. 8. This is because the number (16) of LTPb's 452-i generated when the maximum capacity of the flash memory 45 is 256 MB is taken into consideration. Here, only the valid flags V0 and V1 are set ON ("1"), thereby making it possible to identify the fact that LTPb's 452-0 and 452-1 are copied to the LTPb areas 443 and 442 of the RAM 44. Namely, in the present embodiment, the valid flag Vi in the register 422 is directed to information indicating LTPb 452-i that exists on the RAM 44. In the present embodiment, LTPb 452-i copied to the LTPb area 443 on the RAM 44 is always LTPb 452-0. In contrast, although LTPb 452-i copied to the LTPb area 442 of the RAM 44 is directed to LTPb 452-1 during startup, it is dynamically switched to LTPb 452-i other than LTPb 452-0 subsequently as described later.

Therefore, each valid flag Vi of the register 422 may be employed to indicate only LTPb 452-i copied to the LTPb area 442.

(B2) Processing During Access Request Acceptance

Figure 13A:
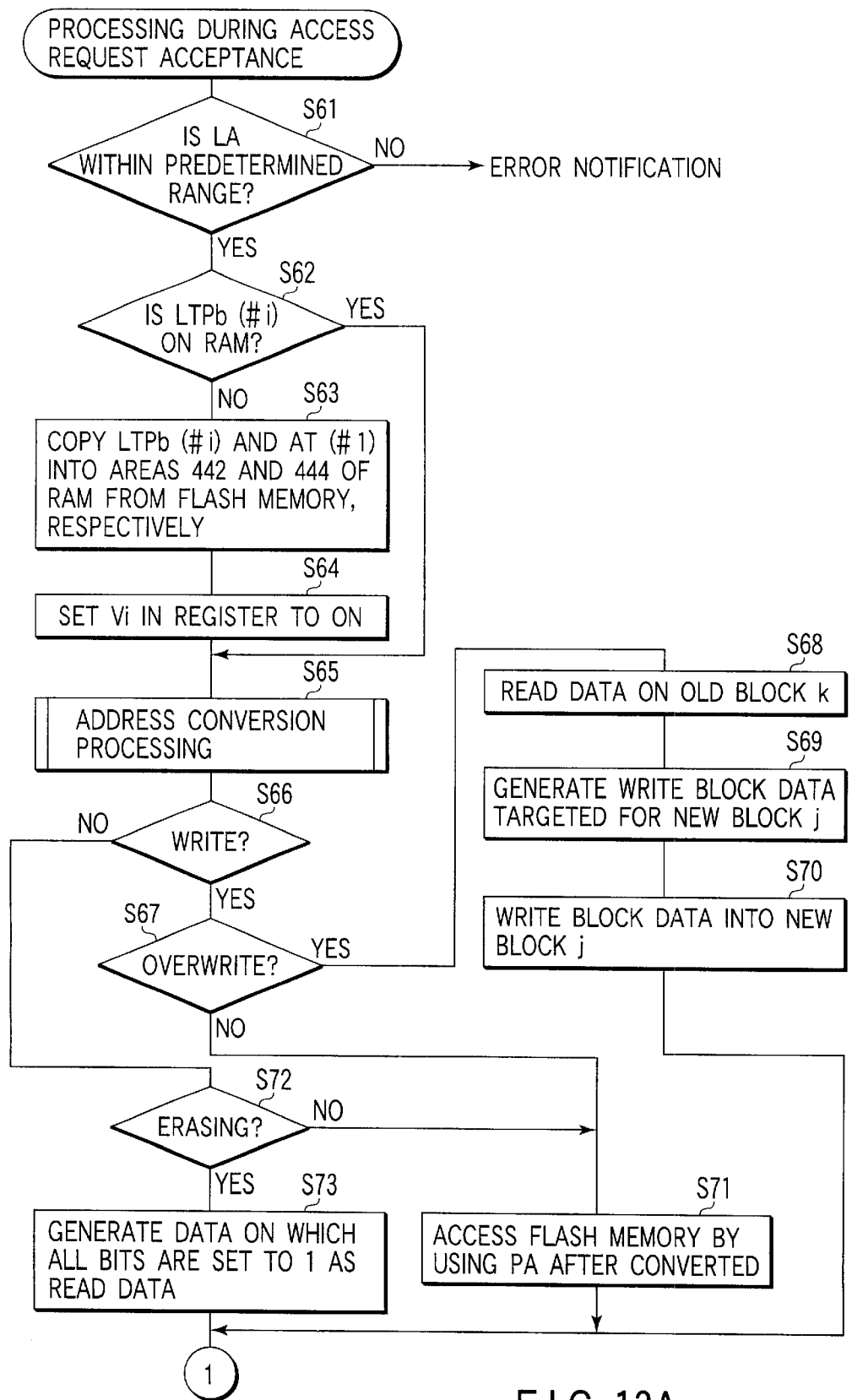
FIGS. 13A and 13B are flowcharts each illustrating processing during access request acceptance in the second embodiment.
Figure 13B:
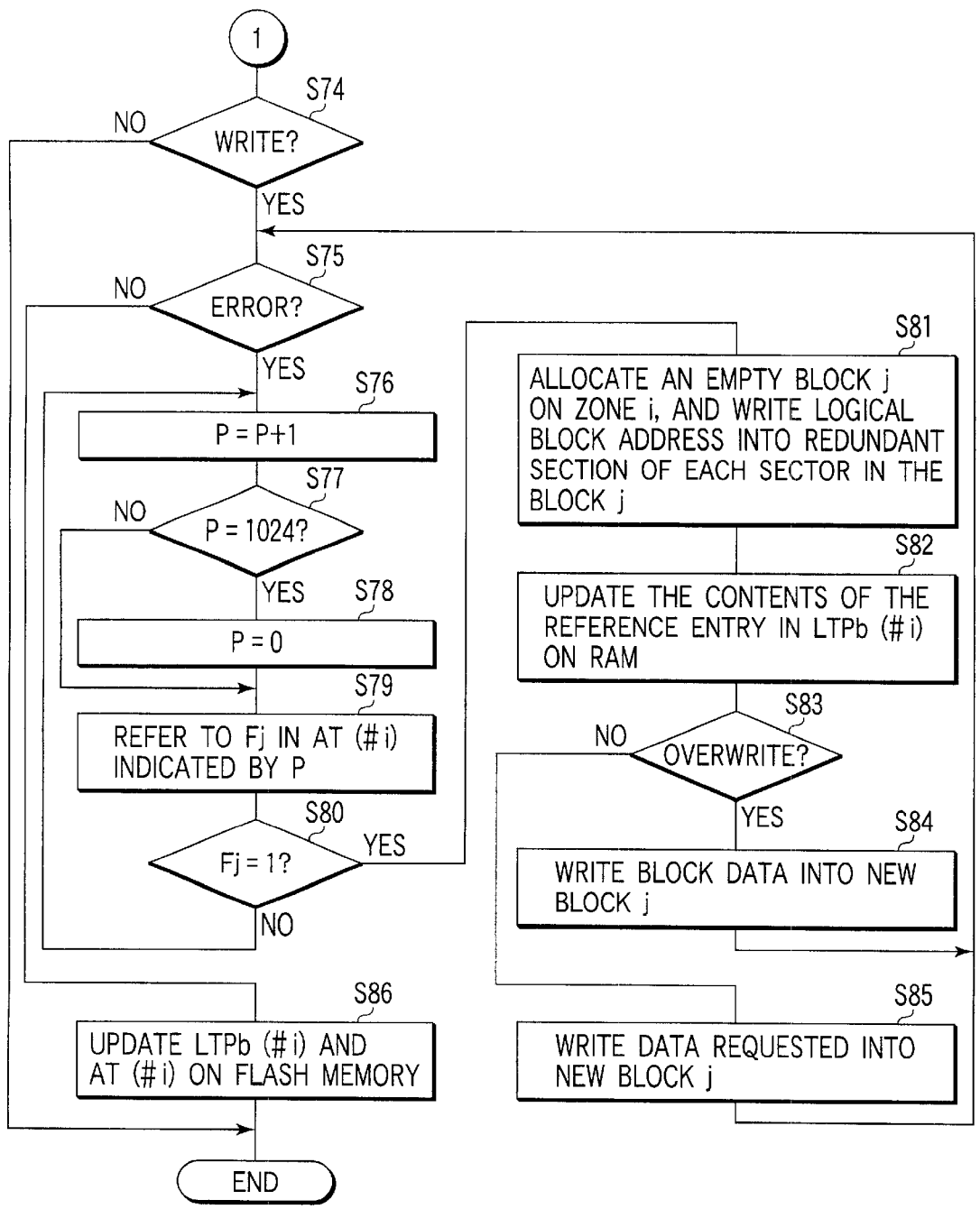
Figure 14:
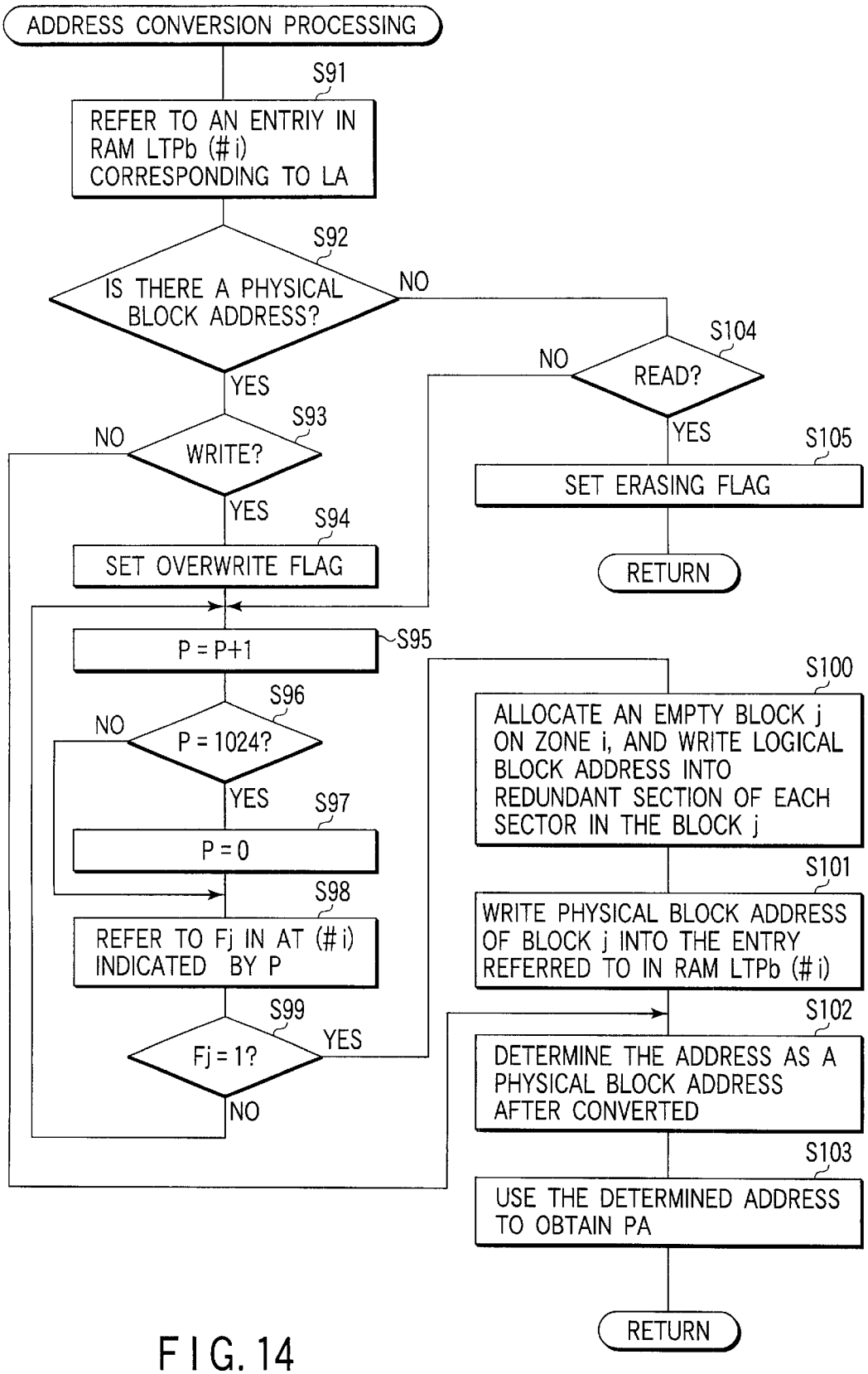
FIG. 14 is a flowchart for illustrating detailed procedures for address translation processing in the step S65 shown in FIG. 13A.

Now, processing to be done when the host interface 41 receives an access request for the flash memory 45 from the host system, and the microprocessor 421 accepts such request in the memory card shown in FIG. 8 will be described with reference to the flowcharts shown in FIGS. 13A and 13B and the flowchart shown in FIG. 14.

First, an access request sent from the host system includes a command indicating a write or read access, a logical address (LA) indicating a start position of an area targeted for access on a logical address space, and a size of the area.

The microprocessor 421 determines whether or not a logical address during an access request from the host system is within the range of a logical address space allocated to the data area 454 of the flash memory 45 (step S61). If the address is outside of the above range, the microprocessor 421 notifies an error as illegal access to the host system. In contrast, when the address is within the range, the microprocessor 421 determines whether or not LTPb 452-i corresponding to the requested logical address exists on the RAM 44 (step S62). The steps S61 and S62 are similar to the steps S11 and S12 shown in FIG. 6A.

When it is determined that LTPb 452-i corresponding to the requested logical address does not exist on the RAM 44, the microprocessor 421 copies LTPb 452-i from the flash memory 45 to the LTPb area 442 of the RAM 44, and copies AT 455-i paired with LTPb 452-i on the flash memory 45 to the AT area 444 of the RAM 44 (step S63). In this manner, LTPb on the LTPb area 442 of the RAM 44 is replaced with LTPb 452-i corresponding to the requested logical address. At the same time, AT on the AT area 444 of the RAM 44 is replaced with AT 455-i paired with this LTPb 452-i. Here, the physical address at the start position in an area on the flash memory 45 in which LTPb 452-i is stored can be acquired by referring to the corresponding entry 'i' of LTPa 45 stored in the LTPa area 441 of the RAM 44 by a value 'i' of the significant four bits of a 14-bit logical block address 34 in the logical address.

Thus, in the present embodiment, when it is determined that LTPb 452-i corresponding to the requested logical address does not exist on the RAM 44, only LTPb on the LTPb area 442 of LTPb's on the LTPb areas 442 and 443 of the RAM 44 is targeted for replacement with LTPb 452-i. In this manner, LTPb 452-0 on the LTPb area 443 of the RAM 44 resides on the RAM 44. This LTPb 452-0 is employed for address translation when a zone 454-0 allocated to the frequently accessed system area is accessed. Therefore, LTPb 452-0 resides on the RAM 44, whereby, even if an access to the system area frequently occurs, replacement of LTPb does not occur, and address translation can always be performed at a high speed by utilizing LTPb 452-0 on the RAM 44.

When the microprocessor 421 executes the step S63, the microprocessor 421 sets to ON ("1") a valid flag Vi in the register 422 specified by a value 'i', of the significant 4 bits of the 14-bit logical block address 34 in the logical address (step S64). At this time, when there exists another valid flag other than valid flags Vi and V0, which has been already in an ON state, these valid flags are set to OFF ("0"). In the case where "NO" is determined at the step S61, the microprocessor 421 proceeds to step S65 after the steps S63 and S64. In the case whether "YES" is determined, the microprocessor 421 proceeds to the step S65. At the step S65, the microprocessor 421 performs address translation processing for translating a requested logical address to a physical address by utilizing LTPb 452-i (i denotes any one of 1 to 3) on the LTPb area 442 or LTPb 452-0 on the LTPb area 443.

Hereinafter, the address translation processing at the step S65 will be described in detail with reference to the flowchart shown in FIG. 14. First, the microprocessor 421 refers to the corresponding entry for LTPb 452-i on the LTPb area 442 or LTPb 452-0 on the LTPb area 443 by using a 14-bit logical block address 34 in the requested logical address (LA) (step S91). In the following description, LTPb 452-i on the LTPb area 442 ('i' denotes any one of 1 to 3) or LTPb 452-0 on the LTPb area 443 may be expressed as LTPb 452-i on the LTPb area 442 or 443 ('i' denotes any one of 0 to 3) or solely LTPb 452-i ('i' denotes any one of 0 to 3) in order to avoid confusion. In addition, AT 455-i on the AT area 444 ('i' denotes any one of 1 to 3) or AT 455-0 on the AT area 445 may be expressed as AT 455-i on the AT area 444 or 445 ('i' denotes any one of 0 to 3) or solely AT 455-i ('i' denotes any one of 0 to 3) in order to avoid confusion.

Next, the microprocessor 421 determines whether or not physical address information of a block specified by a 14-bit logical block address 34 is set to the entry referred to, according to whether or not data is written in the entry (step S92). If the data is written, the entry is not erased. If the data is not written, the entry is erased. In the present embodiment, physical address information registered in LTPb 452-i entry is directed to physical block address other than the least significant 14 bits of the physical address. If data on all 14 bits set to "0" is linked with the least significant bits of this physical block address, the start physical address of the block is obtained. Thus, a physical address is substantially registered as physical address information in LTPb 452-i entry. Therefore, the above step S92 is equivalent to determining whether or not a physical address (PA) is set to the entry referred to.

When physical address information (physical block address) is set to the entry referred to, the microprocessor 421 determines whether an access request from the host system is a write or read request (step S93). In the case of a write access, the microprocessor 421 determines that there occurs overwrite into a block 'k' ('k' denotes any one of 0 to 1023) in which the 14-bit logical block address 34 in the requested logical address (LA) is allocated, i.e., new data write into the block 'k' in which data has been already written, and sets an overwrite flag (step S94).

Next, the microprocessor 421 increments by one a pointer P added to AT 455-i paired with LTPb 452-i referred to at the step S91 of AT 455-i on the AT area 444 or 445 of the RAM 44. Then, the microprocessor 421 determines whether or not the pointer P after incremented reaches 1024 (steps S95 and S96). If the pointer P after incremented reaches 1024, the microprocessor 421 determines that a flag 'Fj' in AT 455-i indicated by the pointer P before incremented is a final flag F1023. In this case, the microprocessor 421 updates the pointer P to 0 so as to indicate the forehead flag F0 in AT 455-i (step S97), and proceeds to step S98. In contrast, if the pointer P after incremented does not reach 1024, the microprocessor 421 proceeds to step S98 intact. At the step S98, the microprocessor 421 refers to the flag 'Fj' in AT 455-i indicated by the current pointer P. Then, the microprocessor 421 determines whether or not the block 'j' in the zone 454-i is an empty block according to whether or not Fj=1 (step S99).

If the block 'j' in zone 454-i is not an empty block, the microprocessor 4421 retries processing of the above step S95 or subsequent, refers to the subsequent flag 'Fj' in AT 455-i in accordance with the pointer P, and determines whether or not Fj=1 (steps S95 to S99).

In this way, the microprocessor 421 repeats an operation for referring to the flag 'Fj' in AT 455-i indicated by the pointer P while the pointer P is incremented until a flag of Fj=1 has been detected in AT 455-i on the RAM 44. When the microprocessor 421 detects a flag of Fj=1 (step S99), a block 'j' on zone 454-i corresponding to the flag Fj is determined as an empty block, and the block 'j' is secured (step S100). Here, securing an empty block denotes setting the block 'j' to be erased. At the step 100, the microprocessor 421 rewrites to 0 a flag of the detected Fj=1 in AT 455-i on the RAM 44 and to 1 a flag Fk corresponding to the block 'k'. In this manner, the block 'j' secured by the microprocessor 421 is switched to an active block, and the block 'k' is switched to an empty block, respectively. In addition, the microprocessor 421 writes a logical block address in the requested logical address into the LBA fields 52 of the redundant sections 51 of all sectors (sectors 0 to 31) in the secured block 'j'. In this manner, a logical block address in the requested logical address is allocated to the secured block 'j'. At this time, the both of flags Fa and Fb of the redundant section 51 are set to 1.

Next, the microprocessor 421 writes a 14-bit physical block address included in the physical address at the start position of the secured block 'j' (in which a logical block address is allocated) into that entry provided in the LTPb area 442 or 443 of the RAM 4, which has been referred to in the step S91 (step S101). The microprocessor 421 proceeds to step S102 at which the newly written physical block address at the step S101 is acquired as a physical block address 35 corresponding to the 14-bit logical block address 34 in the requested logical address.

Thus, in the present embodiment, when there occurs overwrite into the block 'k' in which the 14-bit logical block address 34 included in the logical address requested from the host system is allocated, a destination to which the logical block address 34 is allocated is changed to an empty block 'j' newly secured from this block 'k'. This is because overwrite into the same block is prevented from being concentrated, and the data erasure count of each block is averaged, thereby extending the service life of the flash memory 45 to the maximum.

On the other hand, when a physical block address is set the entry referred to, and a read access is provided (steps S92 and S93), the microprocessor 421 proceeds to step S402 intact at which the physical block address is acquired as a physical block address 35 corresponding to the 14-bit logical block address 34 in the requested logical address.

In addition, even when a physical block address is not set in the entry referred to (step S92), the microprocessor 421 determines whether an access request from the host system is a read or write request (step S104). If no physical block addresses are set in the entry denotes that, it means that no data is written into the block after a block in which the 14-bit logical block address 34 in the requested logical address is allocated is erased. When a physical block address is not set in the entry referred to, and a read access is provided, the microprocessor 421 sets an erasing flag (step S105), and forcibly terminates address translation processing. In contrast, when a physical block address is not set in the entry referred to, and a write access is provided (steps S92 and S104), the microprocessor 421 executes processing (steps S95 to S102) in the same manner as that when a physical block address is set in the entry referred to, and a write access is provided. However, overwrite does not occur, and thus, overwrite flag setting (step S94) is not performed.

When the microprocessor 421 executes step S102, the least significant 14 bits of the requested logical address (LA), i.e., 14 bits consisting of a 5-bit sector address 32 and a 9-bit offset 33 are linked with the least significant bits of the physical block address acquired at the step S102, thereby acquiring a target physical address (PA) (step S103). In this manner, address translation processing at step S65 at which the requested logical address (LA) is translated into a physical address (PA) is terminated.

When the address translation processing at step S65 is terminated, the microprocessor 421 determines whether an access request from the host system is a write or read access (step S66). In the case of a write access, the microprocessor 421 determines whether or not an overwrite flag is set (step S67). When the overwrite flag is set, the microprocessor 421 reads data on a block 'k' (namely, old block 'k') in which the logical block address 34 in the requested logical address should have been allocated (step S68). Then, the microprocessor 421 generates write block data targeted for a block 'j' (namely, a new block 'j') in which the logical block address 34 is newly allocated (step S69). This write block data is generated by replacing that part of the data of the block 'k' with the write data requested for by the host system, said part of the data corresponding to the write data. Then, the microprocessor 421 writes generated write block data into a new block 'j' (step S70). The flag Fb of the redundant section 51 of each sector into which the data in a new block 'j' is written is rewritten from 1 to 0, and the flags Fa and Fb of the redundant section 51 are set to 1 and 0, respectively. On the other hand, when the overwrite flag is not set, the microprocessor 421 accesses the flash memory 45 based on a physical address (PA) obtained by the address translation processing at the step S65, and writes requested data targeted for an area in requested size beginning at a position specified by the physical address (PA) (step S71).

In addition, when an access request from the host system is a read request (step S66), the microprocessor 421 determines whether or not an erasing flag is set (step S72). If such erasing flag is not set, the microprocessor 421 access the flash memory 45 based on a physical address (PA) obtained by address translation processing at the step S65, and reads data targeted for an area in requested size beginning at a position specified by the physical address (PA) (step S71). The data read at the step S71 is transferred to the host system via the host interface 41. In contrast, when the erasing flag is set, namely, when a block specified by the physical address (PA) obtained by the address translation processing at the step S65 is erased (step S72), the microprocessor 421 generates data on all bits in requested size set to "1" as read data, and transfers the data to the host system via the host interface 41 (step S73).

When the microprocessor 421 executes the step S70, S71 or S73, the microprocessor 421 proceeds to step S74 at which it is determined whether a write or read access is provided. In the case of a read access, the microprocessor 421 terminates a series of processing during access request acceptance. When the step S73 is executed, the microprocessor 421 can terminal processing during access request acceptance intact. In contrast, in the case of a write access, the microprocessor 421 determines whether or not a write error occurs (step S75). This determination is performed by reading written data and comparing the read data with original write data. Clearly, when the comparison result is not coincident, it is determined as a write error.

When a write error occurs, the microprocessor 421 determines that an entire block including a sector at which such write error occurs is faulty, namely, that a block error occurs. Then, the microprocessor 421 performs processing for substituting the entire block by another empty block as follows.

First, the microprocessor 421 executes processing (steps S76 to S82) in the same way as in the steps S95 to S101. That is, the microprocessor 421 detects a flag of Fj=1 from AT 455-i paired with LTPb 452-i referred to at the step S91, AT 455-i being included in ATS 455-i on the AT area 444 or 445 of the RAM 44 (step S76 to S80). Then, the microprocessor 421 secures an empty block 'j' corresponding to the detected flag 'Fj' as a substituting block from the zone 454-i on the flash memory 45 (step S81). At the step S81, the microprocessor 421 writes a logical block address included in the requested logical address into the LBA field 52 of the redundant section 51 of each sector provided in the secured block 'j'. In addition, the microprocessor 421 updates the contents of the entry in LTPb 452-i on the RAM 44 that was referred to at step S91 to a physical block address of the secured block 'j' (step S82). In this case, of the flags of AT 455-i in the RAM 44 paired with LTPb 452-i referred to at the step S91, a flag 'Fk' corresponding to a block 'j' (hereinafter, referred to as "old block k") in which a write error occurs is reset to 1, and a flag 'Fj' corresponding to an empty block 'j' newly secured at the step S81 (hereinafter, referred to as new block 'j') is reset to 0, respectively.

Next, the microprocessor 421 determines whether or not an overwrite flag is set (step S83). When the overwrite flag is set, the microprocessor 421 executes processing (step S84) in the same way as in the step S70. That is, the microprocessor 421 writes into a new block 'j' the block data employed for writing into the old block 'k' in which a write error occurs. In contrast, when the overwrite flag is not set (step S83), the microprocessor 421 executes processing (step S85) in the same way as in the step S71, and writes requested data into the new block 'j'. The microprocessor 421 returns to step S75 after it has executed the step S84 or S85.

On the other hand, when it is determined at the step S75 that no write error occurs, the microprocessor 421 updates LTPb 452-i and AT 455-i on the zone 454-i of the flash memory 45 (step S86). This updating processing for LTPb 452-i and AT 455-i is achieved by securing an empty block on the zone 454-i and writing a pair of LTPb 452-i after updated and AT 455-i after updated into the empty block. Here, LTPb 452-i after updated denotes LTPb 452-i placed on the RAM 44 including the entry referred to at the step S91. In addition, AT 455-i after updated denotes AT 455-i paired with the above LTPb 452-i, AT 455-i being placed on the RAM 44. At the step S86, the corresponding flag 'Fb' of the redundant section 51 of each sector is changed from 1 to 0 for an original block in which LTPb 452-i and AT 455-i before updated on the flash memory 45 is stored, and the flags Fa and Fb of the redundant section 51 are set to 0 and 0, respectively. In this manner, LTPb 452-i in this block is indicated to be an old LTPb.

Thus, in the present embodiment, LTPb 452-i and AT 455-i after updated are written into a newly secured empty block rather than a block in which LTPb 452-i and AT 455-i before updated are stored. This is because overwriting into the same block is prevented from being concentrated, and the data erasure count of each block is averaged, thereby extending the service life of the flash memory 45 to the maximum. The microprocessor 421 terminates a series of processings during access request acceptance after it has executed the step S85.

In the present embodiment as described hereinbefore, although there has been described a case in which two of LTPb's 452-0 to 452-3 stored in the flash memory 45 are stored in the RAM 44 as well, the present invention is applicable to a configuration in which a plurality of LTPb's fewer than a total number of LTPb's stored in the flash memory 45 are stored in the RAM 44 as well.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A memory storing a plurality of address translation tables to translate into a physical address a logical address given to access said non-volatile memory, said plurality of address translation tables being associated with respective different logical address ranges;

a volatile memory having an address translation table area for storing at least one table fewer than the total number of the tables of said plurality of address translation tables on said non-volatile memory; and means for translating a logical address into a physical address by utilizing said address translation table on said volatile memory.

2. The memory system according to claim 1, further comprising:

means for, when a logical address is given for accessing said non-volatile memory, determining whether said address translation table corresponding to the logical address range to which the logical addresses belong exists on said volatile memory; and means for, when it is determined by said determining means that said corresponding address translation table does not exist on said volatile memory, copying the address translation table from said non-volatile memory to the address translation table area on said volatile memory, thereby replacing an original address translation table on the address translation table area with the address translation table.

3. The memory system according to claim 2, further comprising a pointer table in which pointer information indicating each storage position of said plurality of address translation tables on said non-volatile memory is registered to be associated with the logical address range specific to each of the address translation tables, wherein, when it is determined by said determining means that said corresponding address translation table does not exist on said volatile memory, said copying means acquires the corresponding pointer information by referring to said pointer table, and copies the address translation table on said non-volatile memory indicated by the pointer information to the address translation table area on said volatile memory.

4. The memory system according to claim 2, further comprising specifying means for specifying that any of said plurality of address translation tables is stored in said volatile memory, wherein said determining means determines whether said address translation tables corresponding to the logical address range to which the given logical addresses belong exist on said volatile memory in accordance with the specification contents of said specifying means.

5. The memory system according to claim 2, wherein:

said non-volatile memory is a rewritable non-volatile memory and consists of a plurality of blocks in which a specific logical block addresses are allocated;

said address translation tables are provided, each for a group of blocks to which logical block addresses are allocated, respectively, which belong to a logical address range and which have each a specific field containing the same data item;

each of the address translation tables has a group of entries that can be designated by the logic block addresses allocated to the blocks of the group corresponding to the group of entries; each entry is provided for registering physical address information that represents a location which a block takes in the non-volatile memory;

when a logical address range to which the given logical address belongs is defined as a logical address range indicated by the contents of the specific field of a logical block address contained in the logical address, said determining means determines whether said address translation table corresponding to this logical address range exists on said volatile memory;

when it is determined by said determining means that said corresponding address translation table exists on said volatile memory, said translating means refers to the corresponding entries in said address translation table on the volatile memory by the logical block address contained in the given logical address, and thereby translates the given logical address to the corresponding physical address, and otherwise, said translating means waits the address translation table has been copied to said volatile memory by said copying means, and then, refers to the corresponding entries of said address translation table on the volatile memory according to the logical block addresses contained in the assigned logical addresses, and thereby translates the given logical address to the corresponding physical address.

6. The memory system according to claim 5, further comprising:

allocating means for, when physical address information is not registered in the entry of said address translation table referred to by said translating means, searching for an empty block on said non-volatile memory, thereby allocating a logical block address in the given logical address to the block; and registering means for writing physical address information on a block in which the logical block address is allocated by said allocating means into an entry referred to in said address translation table on said volatile memory and entry in the address translation table on said non-volatile memory corresponding to the entry referred to.

7. The memory system according to claim 5, further comprising:

means for, when writing into said non-volatile memory is performed based on the physical address translated by said translating means, detecting whether or not a block error occurs; and substituting means for, when an occurrence of said block error is detected by said detecting means, searching an empty block on said non-volatile memory to allocate a logical block address contained in the given logical address to the block, thereby updating, to physical address information of the block, an entry referred to in said address translation table on said volatile memory and an entry in address translation table on said non-volatile memory corresponding to the entry referred to.

8. The memory system according to claim 5, wherein said copying means copies, during startup of said memory system, at least one table fewer than the total number of the tables of said plurality of address translation tables on said non-volatile memory to said address translation table area on said volatile memory.

9. The memory system according to claim 5, wherein:

a pointer table area for storing a pointer table is secured on said volatile memory;

pointer information indicating each storage position on said non-volatile memory of said plurality of address translation tables is registered on said pointer table to be associated with the contents of a specific filed of a logical block address specific to each of the address translation tables; and when it is determined by said determining means that said corresponding address translation table does not exist on said volatile memory, said copying means refers to said pointer table in accordance with the contents of said specific field of a logic block address contained in the given logical address to acquire the corresponding pointer information, and copies said address translation table on said non-volatile memory indicated by the pointer information to the address translation area table on said volatile memory.

10. The memory card according to claim 9, further comprising generating means for, during startup of said memory system, generating said pointer table to be stored in said pointer table area of said volatile memory.

11. The memory system according to claim 5, wherein:

said non-volatile memory is managed in units of zones each consisting of a group of blocks to which logical block addresses are allocated, respectively, which belong to a logical address range and which have each a specific field containing the same data item; any one of the zones is allocated to a system area including a management area storing system management information;

said each address translation table is stored in any one block included in the corresponding zone of said non-volatile memory;

said copying means copying, at the time of starting up the memory system, an address translation table stored in at least one of zones of said non-volatile memory, excluding the zone allocated to the system area and an address translation table stored in the zone allocated to the system area to the address translation table area of said volatile memory; and when said determining means determines that said corresponding address translation table does not exist on said volatile memory, the copying means substitutes for said corresponding address translation table any one address translation table excluding an address translation table corresponding to said system area from among the address translation tables on the address translation table area.

12. The memory system according to claim 11, wherein:

a pointer table area for storing a pointer table is secured on said volatile memory;

pointer information indicating each storage position in said non-volatile memory of said address translation tables is registered in said pointer table and associated with the contents of the specific field of a logical block address specific to each of the address translation table;

each block on said non-volatile memory consists of a plurality of sectors having a predetermined size that is a minimum unit of access to the memory;

each of said sectors comprises a logical block address field in which a logical block address allocated to a block to which the sector belongs is set and a flag field in which flag information indicating a use state of the block is set;

said flag information indicates one of three use states of the blocks, in the first of which the blocks are used to store a valid address translation table, in the second of which the blocks are used to store an invalidated address translation table, and in the third of which the blocks are used to store valid data other than an address translation table;

said memory system further comprises means for generating said pointer table having registered pointer information acquired by said each zone of said non-volatile memory during startup of said memory system;

said generating means sequentially refers to blocks in the zone by said each zone of said non-volatile memory, and detects a sector indicated to be employed for storing a valid address translation table by a flag field of said redundant section, thereby acquiring said pointer information;

said copying means acquires, when it is determined by said determining means that said corresponding address translation table does not exist on said volatile memory, the corresponding pointer information by referring to said pointer table in accordance with the contents of the specific field of the logical block address included in the given logical address, and thereby copies to said address translation table area on said volatile memory said address translation table on said non-volatile memory indicated by the pointer information.

13. The memory system according to claim 12, further comprising:

allocating means for, when physical address information is not registered in an entry for said address translation table on said volatile memory, said entry having been referred to by said translating means, searching for an empty block provided in a zone in which an address translation table on said non-volatile memory corresponding to the address conversion table on said volatile memory is stored, and allocating to the block a logical block address contained in the given logical address;

registering means for writing physical address information of the block in which the logical block address is allocated by said allocating means into the entry for said address translation table on said volatile memory refereed to by said translating means; and update means for searching an empty block targeted for a zone in which an address translation table on said non-volatile memory is stored, the table corresponding to said address translation table on said volatile memory refereed to by said translating means, and writing said address translation table in which physical address information written by said registering means into a predetermined area included in the block, wherein said update means is adopted to set flag information indicating the first state to a flag field of the redundant section of each sector in the predetermined area in which said address translation table is written, and to set flag information indicating the second state to a flag field of the redundant section of each sector in an area in which an original address translation table on said non-volatile memory is stored.

14. The memory system according to claim 13, further comprising:

detecting means for, when writing into said non-volatile memory is performed based on a physical address translated by said translating means, detecting whether a block error occurs or not; and substituting means for, when an occurrence of a block error is detected by said detecting means, searching an empty block targeted for a zone in which an address translation table on said non-volatile memory is stored, the table corresponding to said address translation table on said volatile memory referred to by said translating means, allocating a logical block address in the given logical address to the block, and updating the entry referred to in said address translation table on said volatile memory based on physical address information of the block, wherein said update means is adopted to search an empty block targeted for a zone in which an address translation table on said non-volatile memory is stored, the table corresponding to said address translation table on said volatile memory refereed to by said translating means, to write said address translation table in which the entry referred to is updated in a predetermined area included in the block by said substituting means, to set flag information indicating the first state to a flag field of the redundant section of each sector in the predetermined area in which the address translation table is written, and to set flag information indicating the second state to a flag field of the redundant section of each sector in an area in which an original address translation table on said non-volatile memory, corresponding to the table is stored.

15. The memory system according to claim 14, further comprising:

assignment table stored to be paired with said address translation table in a block in which the address translation table is stored by each zone of said non-volatile memory, wherein:

said assignment table contains flag information indicating whether the blocks in said corresponding zone are used;

an assignment table area for storing said assignment table paired with said plurality of address translation tables on said non-volatile memory stored in said address translation table area is secured on said volatile memory; and any of said allocating means, said update means and substituting means are adopted to search said empty block by referring to, in a predetermined direction, said assignment table on the volatile memory paired with said address translation table on said volatile memory referred to by said translating means.

16. The memory system according to claim 15, wherein:

a pointer specifying a reference position in said assignment table is added to each said assignment table; and any of said allocating means, said update means and said substituting means are adopted to refer to said assignment table while said pointer added to said assignment table is advanced in a predetermined direction.

17. The memory system according to claim 16, wherein:

any of said allocating means, said update means and said substituting means are adopted to update said assignment table when said empty block is searched by referring to said assignment table on said volatile memory, and said update means writes into said empty block said assignment table provided on said volatile memory and paired with the table when said address translation table on said volatile memory is written into said empty block.

18. A method of translating a logical address given to access a non-volatile memory, into a physical address, said non-volatile memory storing a plurality of address translation tables employed for translating into a physical address a logical address given to access said non-volatile memory, said address translation tables being associated with the respective different logical address ranges, said method comprising the steps of:

storing in an address translation table area secured on a volatile memory a plurality of tables fewer than the total number of the tables of said plurality of address translation tables stored in said non-volatile memory; and when a logical address for accessing said non-volatile memory is given, translating the logical address into a physical address by utilizing one of said plurality of address translation tables on said volatile memory.

19. A method of translating into a physical address a logical address given to access a non-volatile memory, which is managed in units of zones each consisting of group of blocks to which logical block addresses are allocated, respectively, which belong to a logical address range and which have each a specific field containing the same data item, one of said zones having been allocated to a system area in which system management information is to be stored, said method comprising the steps of:

preparing address translation tables for groups of blocks, each address translation table having a group on entries for registering physical address information indicating the positions at which the blocks are stored on the non-volatile memory, said blocks each having a specific field containing the same data item and being to be designated by the logical block address contained in a logical address;

storing each address translation table, thus prepared, into one of blocks provided in that zone of the non-volatile memory which corresponds to the address translation table;

copying an address translation table stored in at least one zone other than the zone allocated to the system area, to an address translation table area secured on a volatile memory;

copying an address translation table stored in the zone allocated to the system area, to the address translation table area secured on the volatile memory;

when a logical address for accessing said non-volatile memory is given, determining whether said address translation table corresponding to the contents of the specific field of the logical address exists on said volatile memory;

when it is determined said corresponding address translation table does not exist on said volatile memory, copying the address translation table from said non-volatile memory to said address translation table area on said volatile memory, replacing with the address translation table any one of the address translation tables other than the address translation table corresponding to the system area, said address translation table being included in a plurality of address translation tables on said address translation table area, and thereafter, referring to the corresponding entry of the copied address translation table on said volatile memory based on a logical block address contained in the given logical address, thereby translating the given logical address into a corresponding physical address; and when it is determined that the corresponding address translation table exists on said volatile memory, referring to the corresponding entry of said address translation table that exists on the volatile memory based on a logical block address contained in the given logical address, thereby translating the given logical address into a corresponding physical address.

* * * * *

UNITED STATES PATENT AND TRADEMARK OFFICE
CERTIFICATE OF CORRECTION

PATENT NO. : 6,377,500 B1
DATED : April 23, 2002
INVENTOR(S) : Fujimoto et al.

It is certified that error appears in the above-identified patent and that said Letters Patent is hereby corrected as shown below:

<u>Title page,</u>
Item [57], ABSTRACT,
Line 7, change "field each" to -- field --.

<u>Column 23,</u>
Line 65, change "a specific" to -- specific --.

<u>Column 24,</u>
Line 26, after "waits" insert -- until --.

<u>Column 25,</u>
Line 10, change "filed" to -- field --.
Line 17, change "logic" to -- logical --.

<u>Column 26,</u>
Lines 51 and 56, change "refereed" to -- referred --.

<u>Column 27,</u>
Line 21, change "refereed" to -- referred --.

<u>Column 28,</u>
Line 41, change "being to be" to -- being --.

Signed and Sealed this

Fourteenth Day of January, 2003

JAMES E. ROGAN
*Director of the United States Patent and Trademark Office*